(12) United States Patent
Yun et al.

(10) Patent No.: US 10,840,183 B2
(45) Date of Patent: Nov. 17, 2020

(54) VERTICAL MEMORY DEVICES INCLUDING STACKED CONDUCTIVE LINES AND METHODS OF MANUFACTURING THE SAME

(71) Applicant: SAMSUNG ELECTRONICS CO., LTD., Suwon-si (KR)

(72) Inventors: Seok-Jung Yun, Iksan-si (KR); Sung-Hun Lee, Yongin-si (KR); Jee-Hoon Han, Hwaseong-si (KR); Yong-Won Chung, Seoul (KR); Seong Soon Cho, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/850,391

(22) Filed: Apr. 16, 2020

(65) Prior Publication Data

US 2020/0243445 A1    Jul. 30, 2020

Related U.S. Application Data

(63) Continuation of application No. 15/256,226, filed on Sep. 2, 2016.

(30) Foreign Application Priority Data

Dec. 17, 2015    (KR) ........................ 10-2015-0180715

(51) Int. Cl.
*H01L 23/528* (2006.01)
*H01L 27/11575* (2017.01)
(Continued)

(52) U.S. Cl.
CPC .... *H01L 23/5283* (2013.01); *H01L 21/76816* (2013.01); *H01L 21/76877* (2013.01);
(Continued)

(58) Field of Classification Search
CPC ........... H01L 23/5283; H01L 27/11582; H01L 27/1157; H01L 23/5226; H01L 21/76816;
(Continued)

(56) References Cited

U.S. PATENT DOCUMENTS 8,325,527 B2 * 12/2012 Jin .................... H01L 27/11519
365/185.17
8,822,285 B2    9/2014 Hwang et al.
(Continued)

FOREIGN PATENT DOCUMENTS

KR    1020110001584 A    1/2011
KR    1020110015338 A    2/2014

*Primary Examiner* — Nelson Garces
(74) *Attorney, Agent, or Firm* — Myers Bigel, P.A.

(57) ABSTRACT

Vertical memory devices and methods of forming the same are provided. The devices may include a gate line structure including gate lines that are stacked in a first direction and extend in a second direction. The device may also include a first step pattern structure including extended gate lines extending from the gate lines and including first step layers and a second step pattern structure contacting the first step pattern structure, including the extended gate lines and including second step layers. An n-th extended gate line (n is an even number) may be disposed at an upper portion of each of the first step layers, and an (n-1)-th extended gate line may be disposed at an upper portion of each of the second step layers. Each of exposed portions of the (n-1)-th extended gate lines serves as a pad region, and the pad regions have different areas.

19 Claims, 35 Drawing Sheets

(51) Int. Cl.
*H01L 27/11565* (2017.01)
*H01L 21/768* (2006.01)
*H01L 23/522* (2006.01)
*H01L 27/1157* (2017.01)
*H01L 27/11582* (2017.01)

(52) U.S. Cl.
CPC ...... *H01L 23/5226* (2013.01); *H01L 27/1157* (2013.01); *H01L 27/11565* (2013.01); *H01L 27/11575* (2013.01); *H01L 27/11582* (2013.01)

(58) Field of Classification Search
CPC ......... H01L 21/76877; H01L 27/11575; H01L 27/11565; H01L 23/528
See application file for complete search history.

(56) References Cited

U.S. PATENT DOCUMENTS

| | | |
|---|---|---|
| 8,890,229 B2 | 11/2014 | Watanabe |
| 8,999,844 B2 | 4/2015 | Freeman et al. |
| 9,165,611 B2 | 10/2015 | Yun et al. |
| 2007/0085847 A1 | 4/2007 | Shishido |
| 2013/0009274 A1 | 1/2013 | Lee et al. |
| 2014/0070295 A1 | 3/2014 | Fukuda et al. |
| 2014/0197546 A1* | 7/2014 | Hwang ............. H01L 27/11548 257/774 |
| 2014/0367764 A1 | 12/2014 | Lee et al. |
| 2015/0054046 A1 | 2/2015 | Higashitani et al. |
| 2015/0129878 A1 | 5/2015 | Shin et al. |
| 2015/0137205 A1 | 5/2015 | Kim et al. |
| 2015/0137216 A1 | 5/2015 | Lee et al. |
| 2017/0053984 A1* | 2/2017 | Sugawara ........... H01L 29/0865 |

* cited by examiner

VERTICAL MEMORY DEVICES INCLUDING STACKED CONDUCTIVE LINES AND METHODS OF MANUFACTURING THE SAME

CROSS-REFERENCE TO RELATED APPLICATIONS

This application is a continuation of U.S. patent application Ser. No. 15/256,226, filed Sep. 2, 2016, which itself claims priority under 35 USC § 119 to Korean Patent Application No. 10-2015-0180715, filed on Dec. 17, 2015, in the Korean Intellectual Property Office (KIPO), the disclosures of both of which are incorporated by reference herein in their entireties.

BACKGROUND

Example embodiments relate to vertical memory devices and methods of manufacturing the same. More particularly, example embodiments relate to vertical memory devices including vertically stacked gate lines and methods of manufacturing the same.

Vertical memory devices including a plurality of memory cells vertically stacked on a substrate have been developed for a high degree of integration. In vertical memory devices, electrical signals may be applied to the vertically stacked memory cells, respectively. Thus, a pad structure for the electrical signals may be beneficial.

SUMMARY

A vertical memory device may include a gate line structure including a plurality of gate lines spaced apart from each other in a first direction that is substantially perpendicular to a top surface of a substrate. Each of the plurality of gate lines may extend in a second direction substantially parallel to the top surface of the substrate. The vertical memory device may also include a vertical channel structure extending through the plurality of gate lines in the first direction and a plurality of extended gate lines. Each of the plurality of extended gate lines may extend from an edge portion of one of the plurality of gate lines in the second direction. The vertical memory device may further include a first step pattern structure including a plurality of first step layers, and each of the plurality of first step layers may include an (n-1)-th one of the plurality of extended gate lines from the substrate and an n-th one of the plurality of extended gate lines from the substrate, and n may be an even number that is equal to or greater than 2. Additionally, the vertical memory device may include a second step pattern structure contacting a sidewall of the first step pattern structure and including a plurality of second step layers. Each of the plurality of second step layers may include the (n-1)-th one of the plurality of extended gate lines from the substrate and the n-th one of the plurality of extended gate lines from the substrate. Each of the n-th ones of the plurality of extended gate lines may include a recessed portion at an end portion thereof in the second direction, and each of the (n-1)-th ones of the plurality of extended gate lines may include an exposed portion that is exposed by the recessed portion of one of the n-th ones of the plurality of extended gate lines that is directly above a respective one of the (n-1)-th ones of the plurality of extended gate lines. Areas of the exposed portions of the (n-1)-th ones of the plurality of extended gate lines may be different.

A vertical memory device may include a gate line structure including a plurality of gate lines spaced apart from each other in a first direction that is substantially perpendicular to a top surface of a substrate. Each of the plurality of gate lines may extend in a second direction that is substantially parallel to the top surface of the substrate. The vertical memory device may also include vertical channel structures, each of which may extend through the plurality of gate lines in the first direction, and a first step pattern structure including a plurality of extended gate lines. Each of the plurality of extended gate lines may extend from an edge portion of one of the plurality of gate lines in the second direction, the first step pattern structure may include a plurality of first step layers, each of the plurality of first step layers may include a first pad region at an end portion thereof in the second direction, each of the first pad regions may include an m-th one of the plurality of extended gate lines from the substrate as an uppermost one, relative to the substrate, of ones of the plurality of extended gate lines that are included in one of the plurality of first step layers and m may be a multiple of 3. The vertical memory device may further include a second step pattern structure contacting a sidewall of the first step pattern structure. The second step pattern structure may include the plurality of extended gate lines, the second step pattern structure may include a plurality of second step layers, each of the plurality of second step layers may include a second pad region at an end portion thereof in the second direction, and each of the second pad regions may include an (m-1)-th one of the plurality of extended gate lines from the substrate as an uppermost one, relative to the substrate, of ones of the plurality of extended gate lines that are included in one of the plurality of second step layers. Additionally, the vertical memory device may include a third step pattern structure contacting a sidewall of the second step pattern structure. The third step pattern structure may include the plurality of extended gate lines, the third step pattern structure may include a plurality of third step layers, each of the plurality of third step layers may include a third pad region at an end portion thereof in the second direction, and each of the third pad regions may include an (m-2)-th one of the plurality of extended gate lines from the substrate as an uppermost one, relative to the substrate, of ones of the plurality of extended gate lines that are included in one of the plurality of third step layers. The third pad regions may have different respective areas.

A vertical memory device may include a gate line structure including a plurality of gate lines spaced apart from each other in a first direction that is substantially perpendicular to a top surface of a substrate. Each of the plurality of gate lines may extend in a second direction that is substantially parallel to the top surface of the substrate. The vertical memory device may also include vertical channel structures. Each of the vertical channel structures may extend through the plurality of gate lines in the first direction. The vertical memory device may further include a first step pattern structure including a plurality of extended gate lines. Each of the plurality of extended gate lines may extend from an edge portion of one of the plurality of gate lines in the second direction, the first step pattern structure may include a plurality of first step layers, each of the plurality of first step layers may include a first pad region at an end portion thereof in the second direction, each of the first pad regions may include an n-th one of the plurality of extended gate lines from the substrate as an uppermost one, relative to the substrate, of ones of the plurality of extended gate lines that are included in one of the plurality of first step layers, and n may be an even number that is equal to or greater than 2. Additionally, the vertical memory device may include a second step pattern structure contacting a sidewall of the first step pattern structure and including the plurality of extended gate lines. The second step pattern structure may include a plurality of second step layers, each of the plurality of second step layers may include a second pad region at an end portion thereof in the second direction, and each of the second pad regions may include an (n-1)-th one of the plurality of extended gate lines from the substrate as an uppermost one, relative to the substrate, of ones of the plurality of extended gate lines that are included in one of the plurality of second step layers. Each of the second pad regions may have a rounded corner that is adjacent an interface between the first and second step pattern structures and is spaced apart from an edge of the each of the second pad regions in the second direction.

A method of manufacturing a vertical semiconductor device may include forming a mold structure on a substrate. The mold structure may include a plurality of insulation layers alternating with a plurality of sacrificial layers along a first direction that is substantially perpendicular to a top surface of the substrate. The method may also include partially etching an uppermost one of the plurality of insulation layers and an uppermost one of the plurality of sacrificial layers to form a lower step portion and a upper step portion at an upper portion of the mold structure, sequentially etching first and second edge portions of the mold structure to form a preliminary step mold structure including a plurality of preliminary pad regions, forming a vertical channel structure that extends through the preliminary step mold structure, etching the preliminary step mold structure to form an opening that divides the preliminary step mold structure into first and second step mold structures and divides each of the plurality of preliminary pad regions into a pair of pad regions, the first and second step mold structures extending in a second direction that is substantially parallel to the top surface of the substrate and replacing the plurality of sacrificial layers with a conductive material to form a plurality of gate lines of a gate line structure, a first step pattern structure and a second step pattern structure. The first step pattern structure may include first pad regions, each of the first pad regions may be at one of first levels at which one of odd numbered ones of the plurality of gate lines from the substrate is disposed, the second step pattern structure may include second pad regions, and each of the second pad regions may be at one of second levels at which one of even numbered ones of the plurality of gate lines from the substrate is disposed.

A vertical memory device may include a plurality of gate lines on a substrate. The plurality of gate lines may be stacked along a first direction that is substantially perpendicular to a top surface of the substrate, and each of the plurality of gate lines may extend longitudinally in a second direction that is substantially parallel to the top surface of the substrate. The vertical memory device may also include a plurality of step layers. Each of the plurality of step layers may include a first extended gate line and a second extended gate line sequentially stacked on the substrate. Each of the first and second extended gate lines may extend from an edge portion of one of the plurality of gate lines in the second direction. Each of the second extended gate lines may include a recessed portion that extends for only a portion of the each of the second extended gate lines in a third direction that is substantially perpendicular to the second direction and exposes a pad region of each of the first extended gate lines that is directly below the each of the second extended gate lines. A first one of the first extended gate lines is between the substrate and a second one of the first extended gate lines, a first pad region of the first one of the first extended gate lines may include an end portion that has a first width in the third direction, and a second pad region of the second one of the first extended gate lines may include an end portion that has a second width in the third direction that is less than the first width of the end portion of the first pad region.

BRIEF DESCRIPTION OF THE DRAWINGS

Example embodiments will be more clearly understood from the following detailed description taken in conjunction with the accompanying drawings. FIGS. 1 to 31 represent non-limiting, example embodiments as described herein.

FIGS. 1A, 1B, 2, 3A and 3B are perspective views, a plan view and cross-sectional views illustrating a vertical memory device in accordance with example embodiments;

FIGS. 4 to 18 are perspective views and plan views illustrating a method of manufacturing a vertical memory device in accordance with example embodiments;

FIGS. 19 and 20 are a perspective view and a plan view illustrating a vertical memory device in accordance with example embodiments;

FIG. 21 is a perspective view illustrating a method of manufacturing a vertical memory device in accordance with example embodiments;

FIGS. 22, 23A, 23B and 23C are plan views and cross-sectional views illustrating a vertical memory device in accordance with example embodiments;

FIGS. 24 to 30 are perspective views, plan views and cross-sectional views illustrating a method of manufacturing a vertical memory device in accordance with example embodiments; and FIG. 31 is a perspective view illustrating a vertical memory device in accordance with example embodiments.

DESCRIPTION OF EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. As used herein, the term "and/or" includes any and all combinations of one or more of the associated listed items.

FIGS. 1A, 1B, 2, 3A and 3B are perspective views, a plan view and cross-sectional views illustrating a vertical memory device in accordance with example embodiments.

Figure 1A:
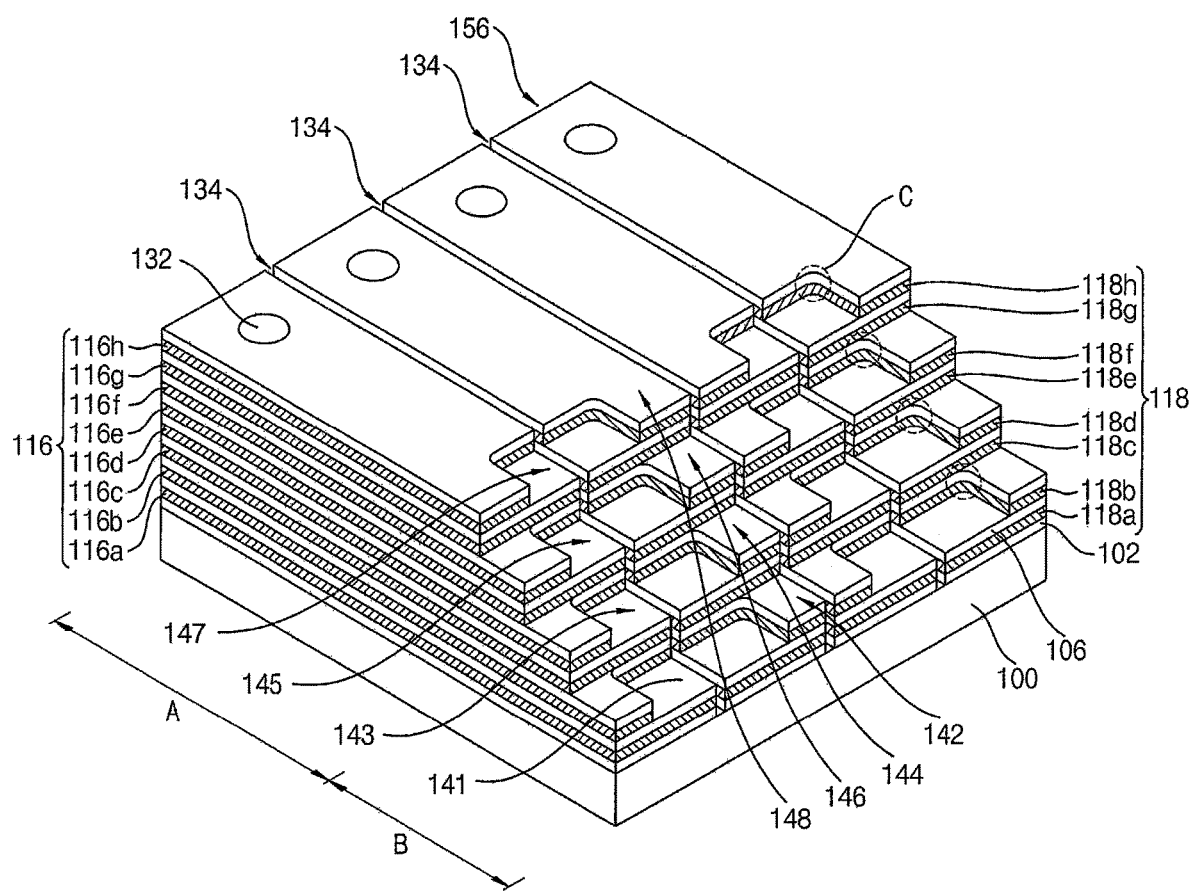
Figure 1B:
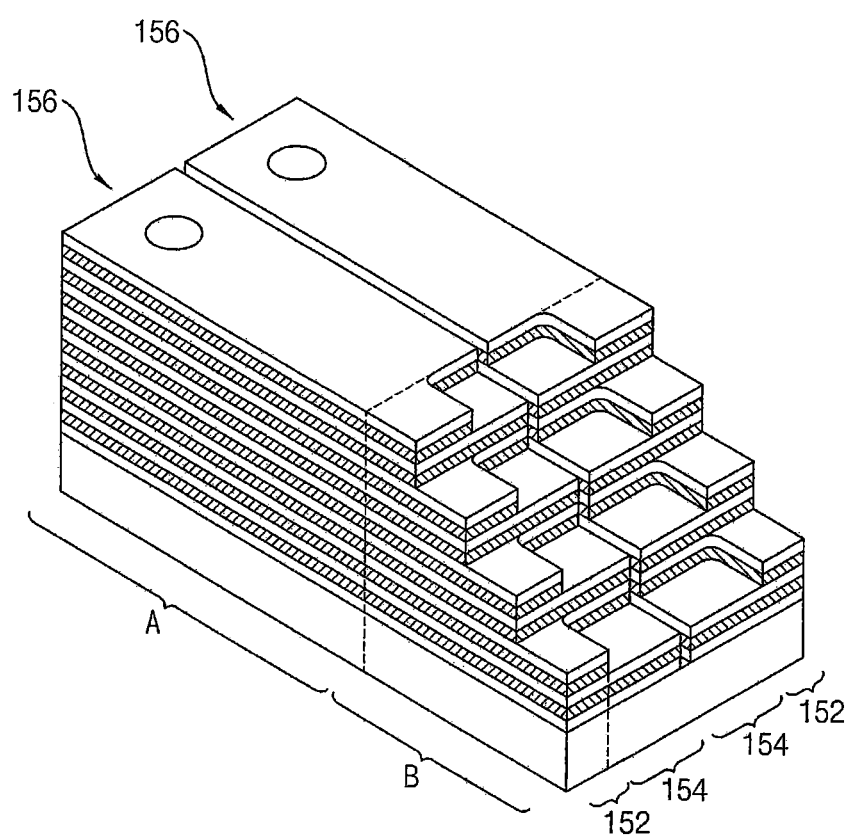
Figure 1B:
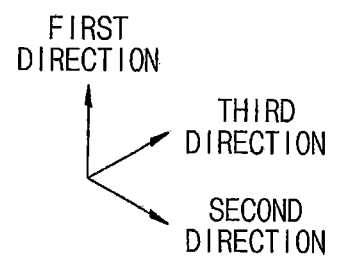
Figure 2:
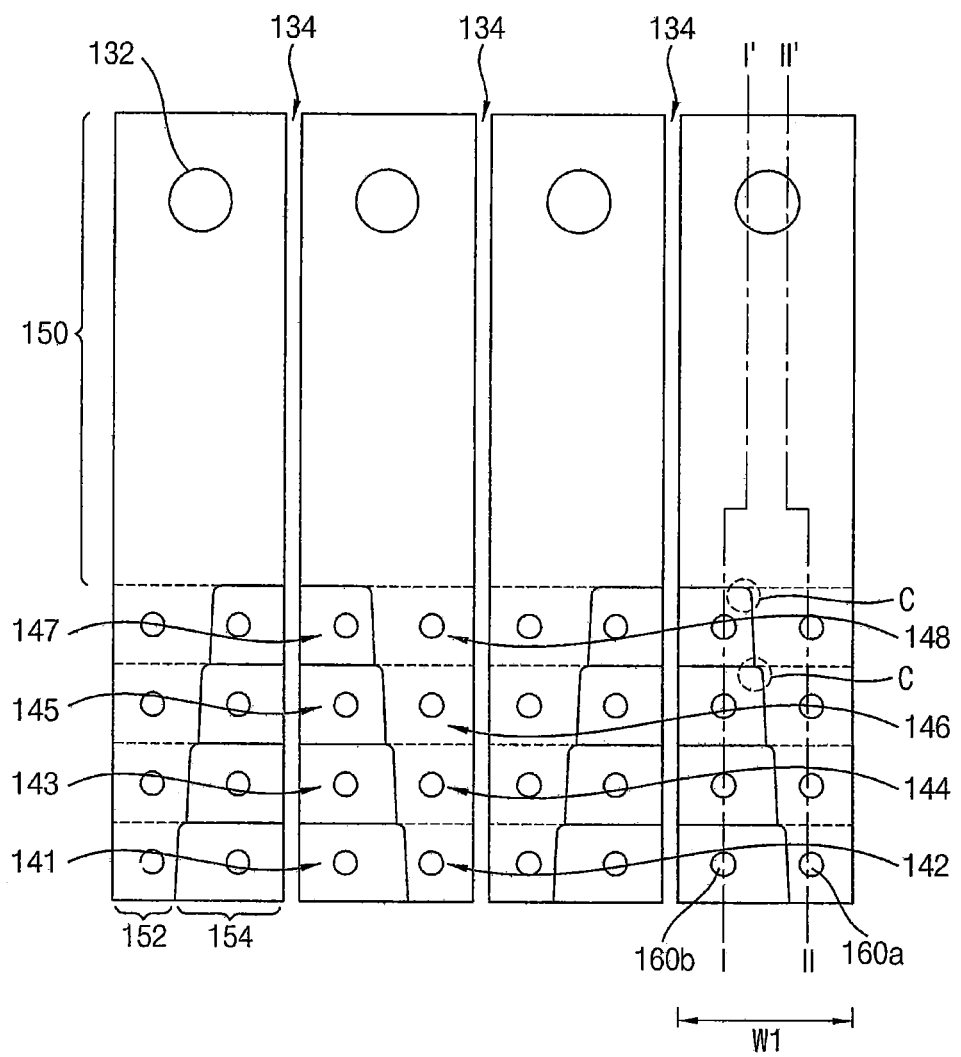
Figure 3A:
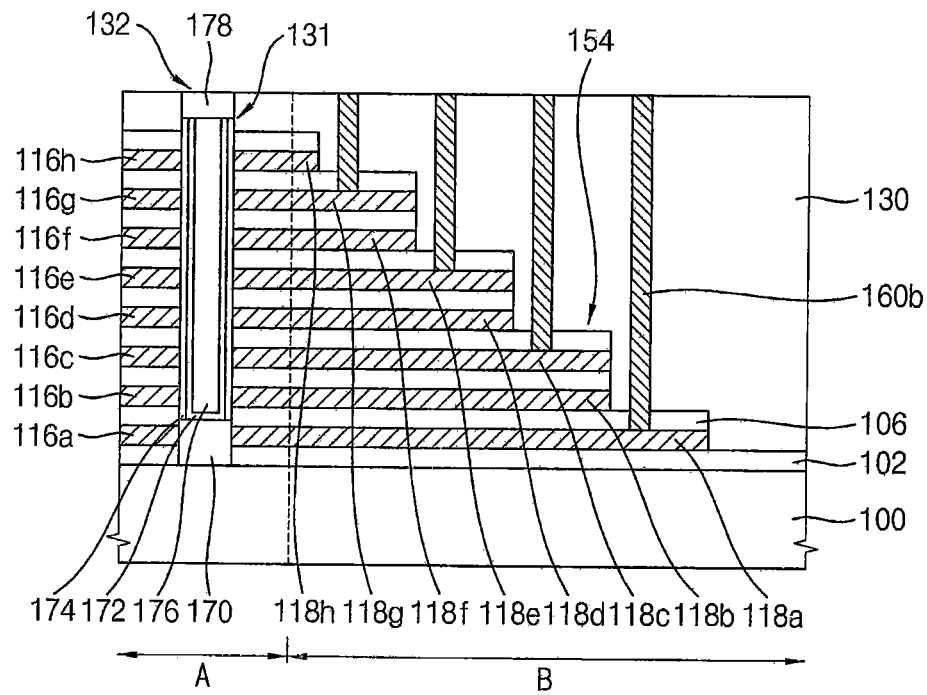
Figure 3B:
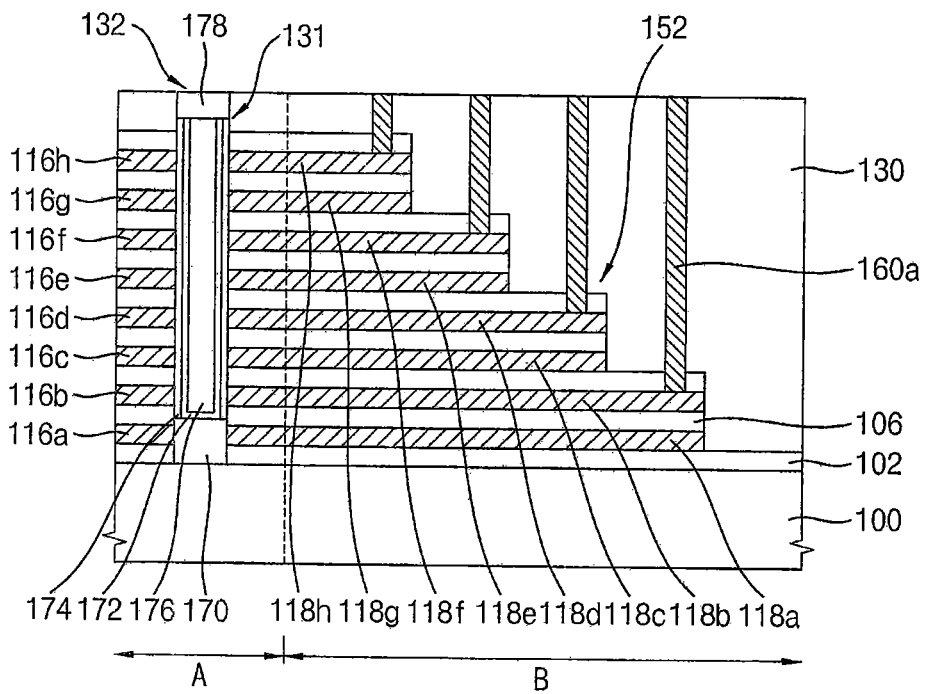

FIGS. 1A, 1B are perspective views, and FIG. 2 is a plan view illustrating the vertical memory device. FIGS. 3A and 3B are cross-sectional views taken along the line I-I' and the line II-II' in FIG. 2, respectively.

Hereinafter, a direction substantially vertical to a top surface of a substrate is referred to as a first direction, and two directions substantially parallel to the top surface of the substrate and crossing each other are referred to as a second direction and a third direction, respectively. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

For convenience of descriptions, the illustration of some insulation layers is omitted in FIGS. 1A, 1B and 2, and the illustration of contact plugs is also omitted in FIGS. 1A and 1B.

Referring to FIGS. 1A, 1B, 2, 3A and 3B, a substrate 100 may include a cell region A and a wiring region B. The cell region A may serve as a region for forming memory cells, and the wiring region B may serve as a region for forming wirings connecting the memory cells to each other. The wiring region B may be close to an edge portion of the cell region A.

The vertical memory device may include a vertical channel structure 132 and a gate line structure 150. The vertical channel structure 132 may be formed on the substrate 100 and may extend in the first direction. The vertical channel structure 132 may extend through the gate line structure 150. The gate line structure 150 may include a plurality of gate lines 116 (e.g., 116a, 116b, 116c, 116d, 116e, 116f, 116g and 116h) sequentially stacked in the first direction, and each of the gate lines 116 may surround the vertical channel structure 132. Each of the gate lines 116 may extend in the second direction.

A first step pattern structure 152 and a second step pattern structure 154 may contact edge portion of the gate line structure 150 in the second direction as illustrated in FIG. 1B. The gate line structure 150 and the vertical channel structure 132 may be formed on the cell region A, and the first and second step pattern structures 152 and 154 may be formed on the wiring region B.

The substrate 100 may include a semiconductor material, e.g., silicon and/or germanium. In example embodiments, the substrate 100 may include single crystalline silicon. In example embodiments, a pad insulation layer 102 in FIGS. 3A and 3B may be formed on the substrate 100.

The vertical channel structure 132 may include a channel 172, a charge storage structure 174 including a tunnel insulation layer, a charge storage layer and a blocking dielectric layer, and a filling insulation pattern 176. The vertical channel structure 132 may extend through the gate line structure 150 in the first direction.

The channel 172 may have a hollow cylindrical shape or a cup-like shape. The channel 172 may include polysilicon and/or single crystalline silicon.

The filling insulation pattern 176 may fill an inner space of the channel 172 and may have a solid cylindrical shape or a pillar shape. The filling insulation pattern 176 may include an insulation material, e.g., silicon oxide. In some embodiments, the channel 172 may have a pillar shape or a solid cylindrical shape, and in this case, the filling insulation pattern 176 may not be formed.

The charge storage structure 174 may include the tunnel insulation layer, the charge storage layer and the blocking dielectric layer that may be sequentially stacked on an outer sidewall of the channel 172. The charge storage structure 174 may surround the outer sidewall of the channel 172. The tunnel insulation layer may include an oxide, e.g., silicon oxide. The charge storage layer may include a nitride, e.g., silicon nitride. The blocking dielectric layer may include silicon oxide or a metal oxide, e.g., hafnium oxide or aluminum oxide.

In example embodiments, a semiconductor pattern 170 may be formed between an upper surface of the substrate 100 and the vertical channel structure 132. The semiconductor pattern 170 may contact the upper surface of the substrate 100. The semiconductor pattern 170 may have a pillar shape. The vertical channel structure 132 may be formed on the semiconductor pattern 170.

A pad pattern 178 may be formed on the channel 172, the charge storage structure 174 and the filling insulation pattern 176. For example, the pad pattern 178 may be electrically connected to a bit line (not shown) of the vertical memory device.

The gate line structure 150 may include gate lines 116 and insulation layers 106 alternately and repeatedly stacked.

The gate lines 116 may include a ground selection line (GSL), word lines and a string selection line (SSL). For example, a lowermost gate line 116a may serve as the GSL, and an uppermost gate line 116h may serve as the SSL. The intermediate gate lines 116b, 116c, 116d, 116e, 116f and 116g between the GSL and the SSL may serve as the word lines, respectively.

Sidewalls of the first and second step pattern structures 152 and 154 may directly contact each other as illustrated in FIG. 1B. Each of the first and second step pattern structures 152 and 154 may include extended gate lines 118 (e.g., 118a, 118b, 118c, 118d, 118e, 118f, 118g and 118h) and the insulation layers 106 between the extended gate lines 118 adjacent in the first direction. The extended gate lines 118 may contact edge portions of the gate lines 116 in the second direction, respectively. The gate line structure 150 and the first and second step pattern structures 152 and 154 may be integrally formed, and may define a single structure, which may be referred to as a gate structure 156. In some embodiments, one of the gate lines 116, e.g., 116a, and one of the extended gate lines 118, e.g., 118a, may have a unitary structure as illustrated in FIGS. 3A and 3B.

In each of the first and second step pattern structures 152 and 154, the extended gate lines 118 and the insulation layers 106 may have lengths in the second direction decreasing from a bottom level toward a top level. In some embodiments, the lengths of the extended gate lines 118 and the insulation layers 106 in the second direction may gradually decrease from a bottom level toward a top level. That is, in a plan view, one of the extended gate lines 118 and one of the insulation layers 106 at the bottom level of each of the first and second step pattern structures 152 and 154 may protrude in the second direction from one of the extended gate lines 118 and one of the insulation layers 106 at the top level of each of the first and second step pattern structures 152 and 154. Thus, each of the first and second step pattern structures 152 and 154 may have a stepped shape including a plurality of step layers each of which may include at least one of the extended gate lines 118 and at least one of the insulation layers 106 sequentially stacked in the first direction as illustrated in FIGS. 3A and 3B.

The gate line 116 and the extended gate line 118 may include substantially the same material. In example embodiments, the gate lines 116 and the extended gate lines 118 may include a metal, e.g., tungsten, a metal silicide and/or a metal nitride. For example, the gate lines 116 and the extended gate lines 118 may include tungsten.

The insulation layer 106 may include, e.g., silicon oxide.

In example embodiments, each of the step layers in the first step pattern structure 152 may include two extended gate lines 118 sequentially stacked. In example embodiments, the first step pattern structure 152 may include a plurality of step layers sequentially stacked in the first direction, and the number of the step layers may be half of the number of the gate lines 116 sequentially stacked in the first direction in the gate line structure 150. For example, when the gate line structure 150 includes eight gate lines 116 sequentially stacked in the first direction, the first step pattern structure 152 may include four step layers sequentially stacked in the first direction.

An n-th one of the extended gate lines 118 (n is an even number equal to or greater than 2) from the upper surface of the substrate 100 (i.e., the n-th extended gate line) may be disposed at an upper portion of each step layer in the first step pattern structure 152. That is, a protruding portion of the n-th extended gate line in the second direction, e.g., each of the protruding portions of the second, fourth, sixth and eighth extended gate lines 118b, 118d 118f and 118h in the second direction may serve as a pad region for contacting a first contact plug 160a. Thus, electrical signals may be applied to each of the gate lines 116, e.g., each of the second, fourth, sixth and eighth gate lines 116b, 116d, 116f and 116h disposed at even-numbered levels from the upper surface of the substrate 100 via the first contact plug 160a contacting the pad region of the first step pattern structure 152. The pad region may be covered by the insulation layer 106. Each of the pad regions of the first step pattern structure 152 may include one of the n-th extended gate lines as an uppermost extended gate line relative to the substrate 100.

In the first step pattern structure 152, a plurality of pad regions e.g., second, fourth, sixth and eighth pad regions 142, 144, 146 and 148 may be defined from the upper surface of the substrate 100 in the first direction.

Each of the step layers, except for a lowermost one of the step layers, in the second step pattern structure 154 may include two extended gate lines 118. In example embodiments, the second step pattern structure 154 may include a plurality of step layers sequentially stacked in the first direction, and the number of the step layers may be half of the number of the gate lines 116 sequentially stacked in the first direction in the gate line structure 150. For example, when 8 gate lines 116 sequentially stacked in the first direction are included in the gate line structure 150, the second step pattern structure 154 may include four step layers sequentially stacked in the first direction.

An (n-1)-th one of the extended gate lines 118 (n is an even number equal to or greater than 2) from the upper surface of the substrate 100 (i.e., the (n-1)-th extended gate line) may be disposed at an upper portion of each step layer in the second step pattern structure 154. That is, a protruding portion of the (n-1)-th extended gate line in the second direction, e.g., each of the protruding portions of the first, third, fifth and seventh extended gate lines 118a, 118c 118e and 118g in the second direction may serve as a pad region for contacting a second contact plug 160b. Thus, electrical signals may be applied to each of the gate lines 116, e.g., each of the first, third, fifth and seventh gate lines 116a, 116c, 116e and 116g disposed at odd-numbered levels from the upper surface of the substrate 100 via the second contact plug 160b contacting the pad region of the second step pattern structure 154. The pad region may be covered by the insulation layer 106. Each of the pad regions of the second step pattern structure 154 may include one of the (n-1)-th extended gate lines as an uppermost extended gate line relative to the substrate 100.

Referring to FIGS. 1A and 3A, in some embodiments, each of the n-th extended gate lines included in the second step pattern structure 154 may include a recessed portion at an end portion thereof in the second direction. Each of the (n-1)-th extended gate lines included in the second step pattern structure 154 may include an exposed portion that is exposed by the recessed portion of one of the n-th extended gate lines that is directly above the each of the (n-1)-th extended gate lines. For example, the second extended gate line 116b of the second step pattern structure 154 may include a recessed portion at an end portion thereof in the second direction, and the first extended gate line 116a of the second step pattern structure 154 that is directly below the second extended gate line 116b may include an exposed portion exposed by the recessed portion of the second extended gate line 116b. Widths of the exposed portions of the (n-1)-th extended gate lines in the third direction may decrease as a height, in the first direction, of the each of the (n-1)-th extended gate lines increases as illustrated in FIGS. 1A and 2.

In the second step pattern structure 154, a plurality of pad regions, e.g., first, third, fifth and seventh pad regions 141, 143, 145 and 147 may be defined from the upper surface of the substrate 100 in the first direction. The exposed portions of the (n-1)-th extended gate lines may be used as the respective pad regions (e.g., first, third, fifth and seventh pad regions 141, 143, 145 and 147). In some embodiments, each of the exposed portions of the (n-1)-th extended gate lines may have a width in the third direction tapered toward the cell region A as illustrated in FIG. 2.

The gate line structure 150 may contact the first and second step pattern structures 152 and 154. Each of the first and second step pattern structures 152 and 154 may extend in the second direction. The first and second step pattern structures 152 and 154 may be arranged in the third direction and sidewalls of the first and second step pattern structures 152 and 154 may contact as illustrated in FIG. 1B.

In the first and second step pattern structures 152 and 154, the n-th pad region and the (n-1)-th pad region arranged in the third direction may have heights, in the first direction, that are different each other.

The gate line structure 150 may have a first width W1 in the third direction as illustrated in FIG. 2. A sum of widths of the first and second step pattern structures 152 and 154 may have the first width W1 in the third direction. Thus, the gate structure 156 may have the first width W1 in the third direction. In some embodiments, the gate structure 156 may have the constant width W1 in the third direction along the second direction as illustrated in FIG. 2.

In the second step pattern structure 154, widths of the pad regions (e.g., 141, 143, 145 and 147) in the third direction may decrease, in some embodiments may gradually decrease, from a bottom level toward a top level as illustrated in FIG. 2. Thus, the width of the first pad region 141 in the third direction may be greater than the width of the third pad region 143 in the third direction. The width of the third pad region 143 in the third direction may be greater than the width of the fifth pad region 145 in the third direction. The width of the fifth pad region 145 in the third direction may be greater than the width of the seventh pad region 147 in the third direction.

In the first step pattern structures 152, widths of the pad regions (e.g., 142, 144, 146 and 148) in the third direction may increase, in some embodiments may gradually increase, from a bottom level toward a top level. Thus, the second pad region 142 may have a smallest width in the third direction as illustrated in FIG. 2. The widths of the pad regions in the third direction may increase from the fourth pad region 144 to the eighth pad region 148.

Thus, the pad regions (e.g., 142, 144, 146 and 148) in the first pattern structure 152 may have different widths in the third direction and the pad regions (e.g., 141, 143, 145 and 147) in the second step pattern structure 154 may have different widths in the third direction.

In the second step pattern structures 154, areas of the (n-1)-th pad regions may gradually decrease from the bottom level toward the top level. In the first step pattern structures 152, areas of the n-th pad regions may gradually increase from the bottom level toward the top level.

Each of the pad regions of the second step pattern structure 154 may have a rounded corner C at a boundary area between the first and second step pattern structures 152 and 154, particularly, at a portion of the boundary area between the first and second step pattern structures 152 and 154 that is closest to the gate line structure 150. Thus, a sidewall of the first step pattern structure 152 near the portion of the boundary area between the first and second step pattern structures 152 and 154 that is closest to the gate line structure 150 may not be bent sharply. In some embodiments, the sidewall of the first step pattern structure 152 adjacent one of the rounded corners C of the pad regions of the second step pattern structure 154 may have a curved shape.

That is, in a plan view, each of the pad regions of the second step pattern structure 154 may include a corner having an arc shape.

An insulating interlayer 130 may cover the gate line structure 150 and the first and second step pattern structures 152 and 154. The insulating interlayer 130 may include, for example, silicon oxide.

As each of the pad regions of the second step pattern structure 154 may have the rounded corner C, the insulating interlayer 130 may fill the boundary area between the first and second step pattern structures 152 and 154. Thus, there may be no or little void therein.

The first contact plugs 160a may contact the pad regions of the extended gate lines 118b, 118d, 118f, 118h of the first step pattern structure 152, respectively and may extend through the insulating interlayer 130.

The second contact plugs 160b may contact the pad regions of the extended gate lines 118a, 118c, 118e, 118g of the second step pattern structure 154, respectively and may extend through the insulating interlayer 130.

The pad regions of the first step pattern structure 152 may have different widths at the respective levels, so that the first contact plugs 160a may be variously disposed on the pad regions, respectively. In example embodiments, in a plan view, the first contact plugs 160a may be arranged in the second direction or the third direction. In some example embodiments, the first contact plugs 160a may be arranged in a diagonal direction with respect to the second direction. In some example embodiments, in a plan view, the first contact plugs 160a may be arranged in a zig-zag pattern. Alternatively, in a plan view, each of the first contact plugs 160a may be disposed on a central portion of each of the pad regions.

The pad regions of the second step pattern structure 154 may have different widths at the respective levels, so that the second contact plugs 160b may be variously disposed on the pad regions, respectively. In example embodiments, in a plan view, the second contact plugs 160b may be arranged in the second direction or the third direction. In some example embodiments, the second contact plugs 160b may be arranged in a diagonal direction with respect to the second direction. In some example embodiments, in a plan view, the second contact plugs 160b may be arranged in a zig-zag pattern. Alternatively, in a plan view, each of the second contact plugs 160b may be disposed on a central portion of each of the pad regions.

It will be understood that the first step pattern structure 152 and the second step pattern structure 154 may be considered one step pattern structure including step layers. Further, it will be understood that a portion of one of extended gate lines 118 (e.g., 118a) included in the first step pattern structure 152 and a portions of the one of extended gate lines 118 (e.g., 118a) included in the second step pattern structure 154 may be considered a single extended gate line 118. Referring again to FIGS. 1A, 3A and 3B, each of the step layers included in the step pattern structure may include a first extended gate line (e.g., 118a) and a second extended gate line (e.g., 118b) that are sequentially staked on the substrate 100 and are directly adjacent each other. The second extended gate line 118b may include a recessed portion that extends for only a portion of the second extended gate line 118b in the third direction and exposes a pad region 141 of the first extended gate line 118a that is directly below the second extended gate line 118b. The first extended gate line 118c may include a pad region 143. A width of the pad region 143 in the third direction may be less than a width of the pad region 141. Widths of the pad regions, 141, 143, 145, 147, in the third direction may decrease as a height, in the first direction, of the first extended gate line 118a, 118c, 118e, 118g increases. Areas of the pad regions, 141, 143, 145, 147, may decrease as a height, in the first direction, of the first extended gate line 118a, 118c, 118e, 118g increases.

For convenience of descriptions, FIGS. 1, 2, 3A and 3B and 2 show the gate lines 116 sequentially stacked at 8 levels, respectively, and the illustration of the contact plugs 160a and 160b are not shown in FIGS. 1A and 1B. However, the number of the gate lines 116 sequentially stacked in the first direction is not limited thereto, and may be properly adjusted in consideration of the circuit design or the degree of integration of the vertical memory device.

The gate structures 156 may be spaced apart from each other in the third direction. That is, an opening 134 may be formed between the gate structures 156 adjacent in the third direction and may extend in the second direction. An insulation pattern (not shown) may be formed in the opening. The insulation pattern may include, for example, silicon oxide.

In some embodiments, neighboring ones of the gate structures 156 in the third direction may be symmetric with respect to the opening 134 as illustrated in FIG. 1A. For example, first one of the gate structures 156 may include the first and second step pattern structures 152 and 154 disposed in this order from left to right in the third direction, and a second one of the gate structures 156 adjacent the first one in the third direction may include the second and the first step pattern structures 154 and 152 disposed in this order from left to right in the third direction.

In the second step pattern structures 154, widths of the pad regions (e.g., 141, 143, 145 and 147) in the third direction from the opening 134 may decrease, in some embodiments may gradually decrease, from a bottom level toward a top level.

Impurity region (not shown) may be formed at an upper surface of the substrate 100 under the insulation pattern. The impurity region may extend in the second direction and may serve as a common source line (CSL) of the vertical memory device.

Alternatively, a CSL may be formed through the insulation pattern and may contact the impurity region.

FIGS. 4 to 18 are perspective views and plan views illustrating a method of manufacturing a vertical memory device in accordance with example embodiments.

FIGS. 4 to 7, 9, 11, 13, 14, 15 and 17 are perspective views, and FIGS. 8, 10, 12, 16 and 18 are plan views. For convenience of descriptions, the illustration of some insulation layers is omitted in some of the perspective views and the plan views.

Figure 4:
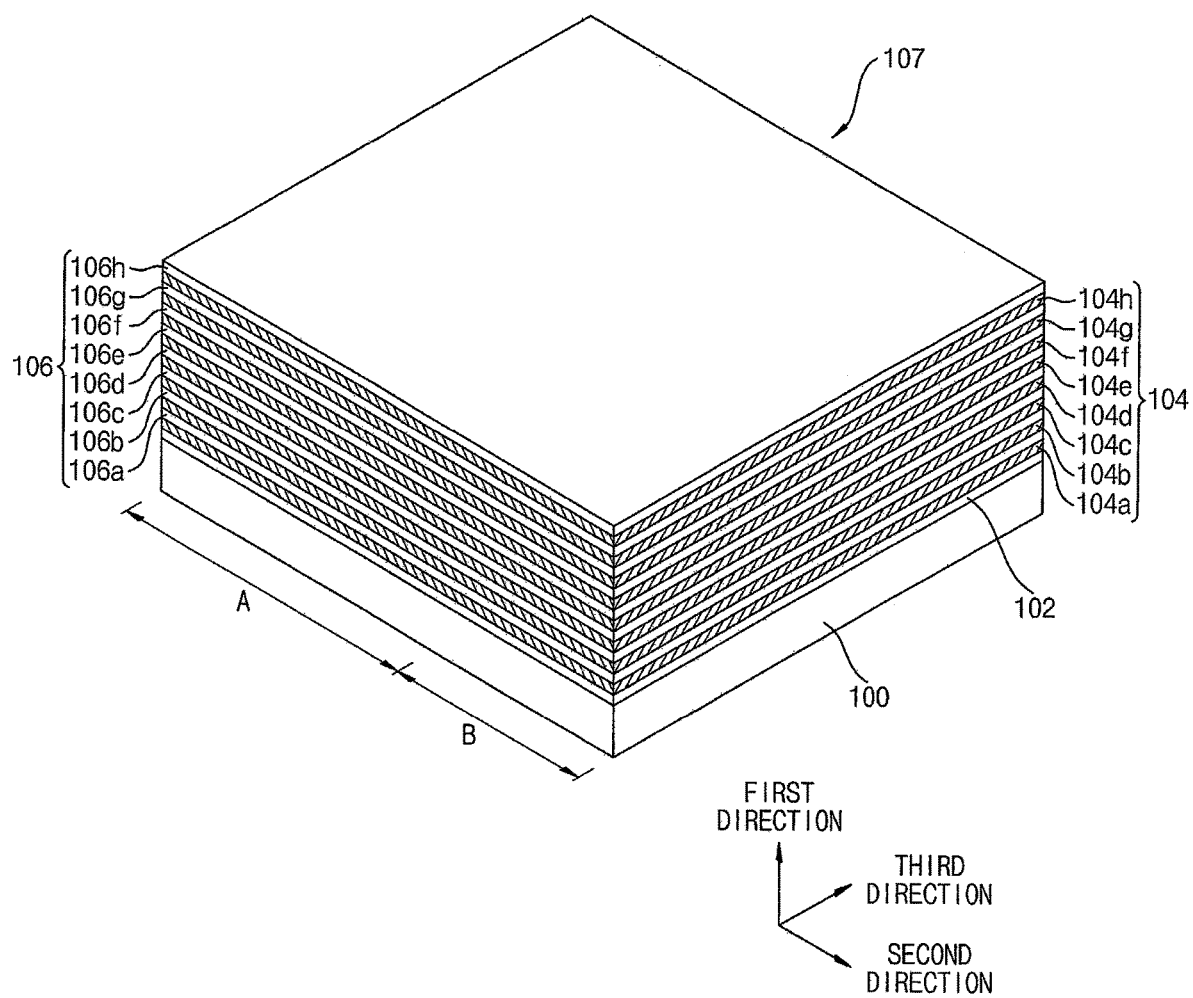

Referring to FIG. 4, a pad insulation layer 102 may be formed on a substrate 100. Sacrificial layers 104 (e.g., 104a, 104b, 104c, 104d, 104e, 104f, 104g and 104h) and insulation layers 106 (e.g., 106a, 106b, 106c, 106d, 106e, 106f, 106g and 106h) may be formed alternately and repeatedly on the pad insulation layer 102 to form a mold structure 107.

The substrate 100 may include a semiconductor material, for example, silicon and/or germanium. In example embodiments, the substrate 100 may include a cell region A and a pad region B.

The pad insulation layer 102 and the insulation layers 106 may be formed of an oxide-based material, e.g., silicon oxide. The sacrificial layer 104 may be formed of a material that may have an etching selectivity with respect to the insulation layer 106 and may be easily removed by a wet etching process. For example, the sacrificial layer 104 may be formed of a nitride-based material, e.g., silicon nitride and/or silicon boronitride.

The pad insulation layer 102, the insulation layer 106 and the sacrificial layer 104 may be formed by a chemical vapor deposition (CVD) process, a plasma enhanced chemical vapor deposition (PECVD) process, a high density plasma chemical vapor deposition (HDP-CVD) process, an atomic layer deposition (ALD) process and/or a sputtering process.

In example embodiments, the pad insulation layer 102 may be formed by a thermal oxidation process or a radical oxidation process on a top surface of the substrate 100.

The sacrificial layers 104 may be removed in a subsequent process to form spaces for a GSL, word lines and an SSL. Thus, the number of the insulation layers 106 and the sacrificial layers 104 may be determined in consideration of the number of the GSL, the word lines and the SSL.

Figure 5:
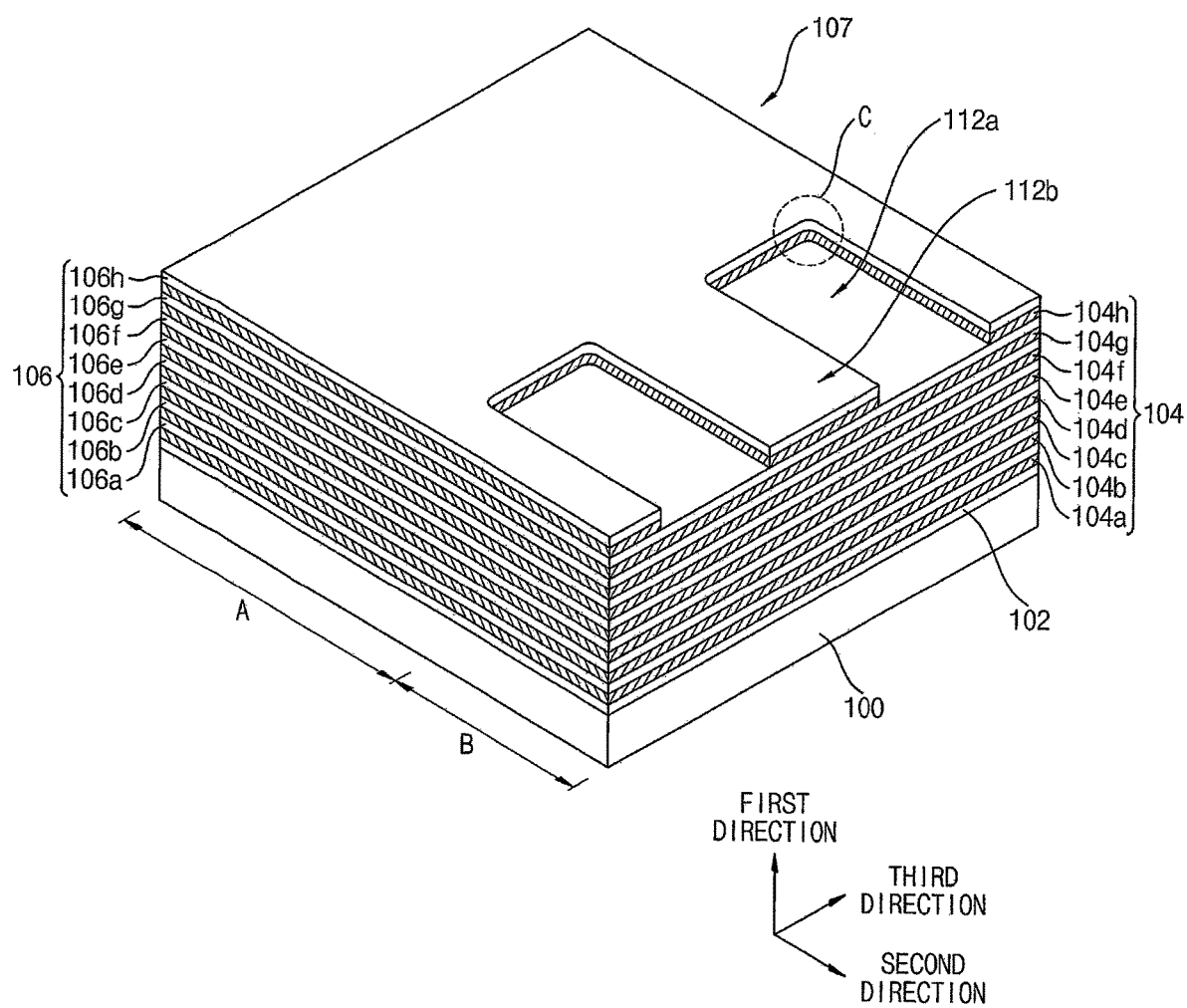

Referring to FIG. 5, an uppermost insulation layer 106h and an uppermost sacrificial layer 104h of the mold structure 107 on the wiring region B may be partially etched to form a plurality of lower step portions 112a.

A photoresist pattern (not shown) may be formed on the mold structure 107 by a photo process. The photoresist pattern may expose a portion of the mold structure 107 on the wiring region B. The uppermost insulation layer 106h and the uppermost sacrificial layer 104h may be etched using the photoresist pattern as an etching mask. Thus, a top portion of the mold structure 107 may include the lower step portions 112a and upper step portions 112b disposed at seventh and eighth levels, respectively, from an upper surface of the substrate 100, which may be alternately and repeatedly arranged in the third direction on the wiring region B. Hereinafter, one insulation layer 106 and one sacrificial layer 104 sequentially stacked may define one level. The number of level of the insulation layers 106 and the sacrificial layers 104 sequentially stacked under the upper step portion 112b may be greater by one than the number of level of the insulation layers 106 and the sacrificial layers 104 sequentially stacked under the lower step portion 112a.

In example embodiments, the lower step portion 112a and the upper step portion 112b may have substantially the same width in the third direction. Alternatively, the lower step portion 112a and the upper step portion 112b may have different widths in the third direction.

A first step pattern structure (e.g., 152 in FIG. 17) may be formed from the upper step portion 112b by subsequent processes, and a second step pattern structure (e.g. 154 in FIG. 17) may be formed from the lower step portion 112a by subsequent processes.

In example embodiments, in a plan view, the lower step portion 112a may have a shape of a rectangle, however, ones of corners of the rectangle, which may be close to the cell region A, may be rounded as shown in a region C in FIG. 5. That is, a sidewall of the upper step portion 112b near the corners of the rectangular shape of the lower step portion 112a that are close to the cell region A may not be bent sharply. In some embodiments, a portion of the sidewall of the upper step portion 112b adjacent the rounded corner of the rectangular shape of the lower step portion 112a may have a curved shape.

During the etching process for forming the lower step portion 112a, the portion of the mold structure 107 above and near the lower step portion 112a may be etched less than other portions thereof due to the three-dimensional effect, and thus the lower step portion 112a may have the rounded corners. In example embodiments, in the etching process for forming the lower step portion 112a, process conditions may be controlled so that an etch rate of the portion of the mold structure 107 above and near the lower step portion 112a may be less than an etch rate of other portions thereof.

Figure 6:
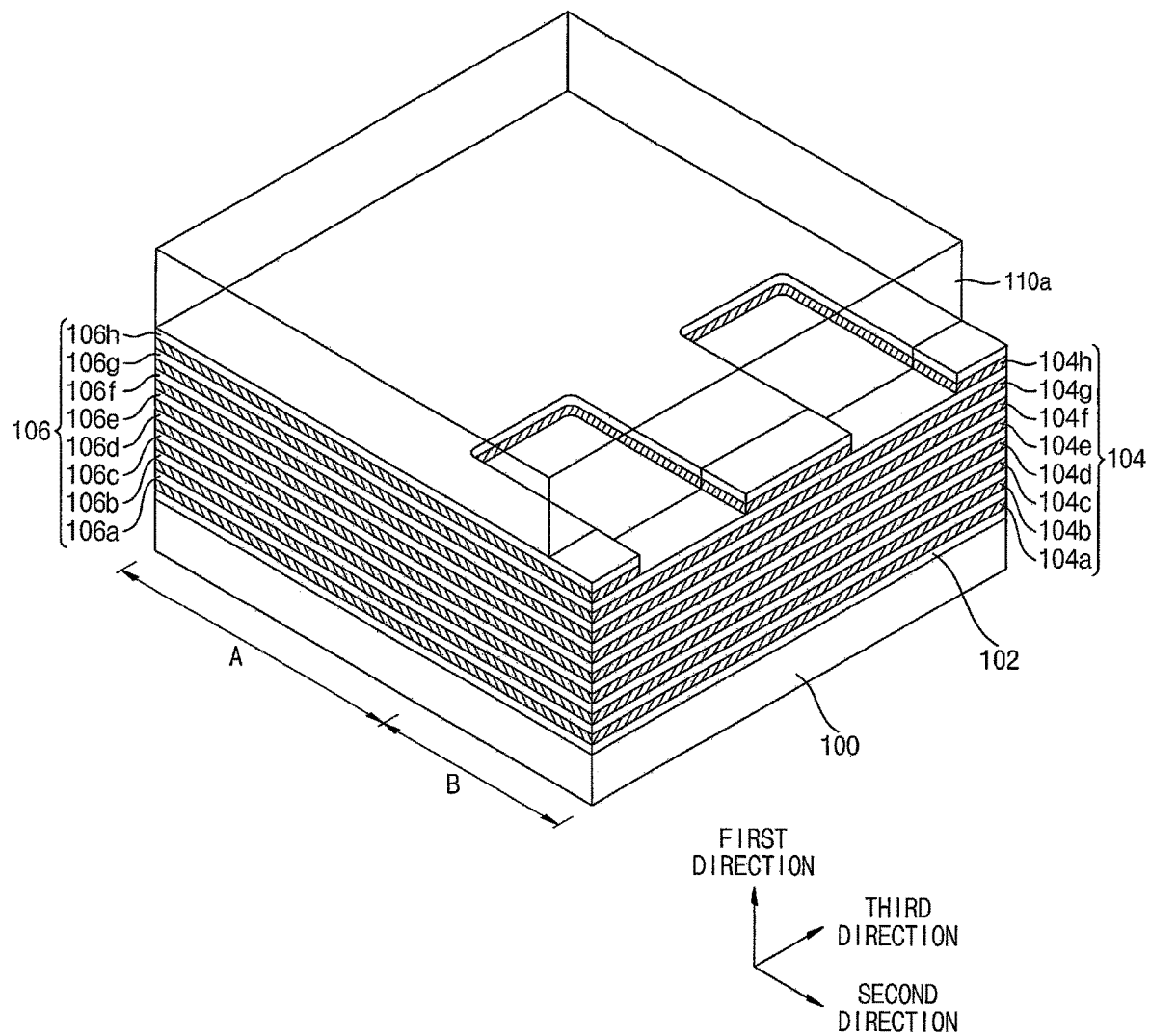

Referring to FIG. 6, a first photoresist pattern 110a may be formed on the mold structure 107.

The first photoresist pattern 110a may be formed to expose an edge portion of the mold structure 107 in the second direction on the wiring region B. In example embodiments, the exposed portion of the mold structure 107 by the first photoresist pattern 110a may extend in the third direction. A width of the exposed portion in the second direction may be substantially the same as a width of a pad region in the second direction subsequently formed.

Figure 7:
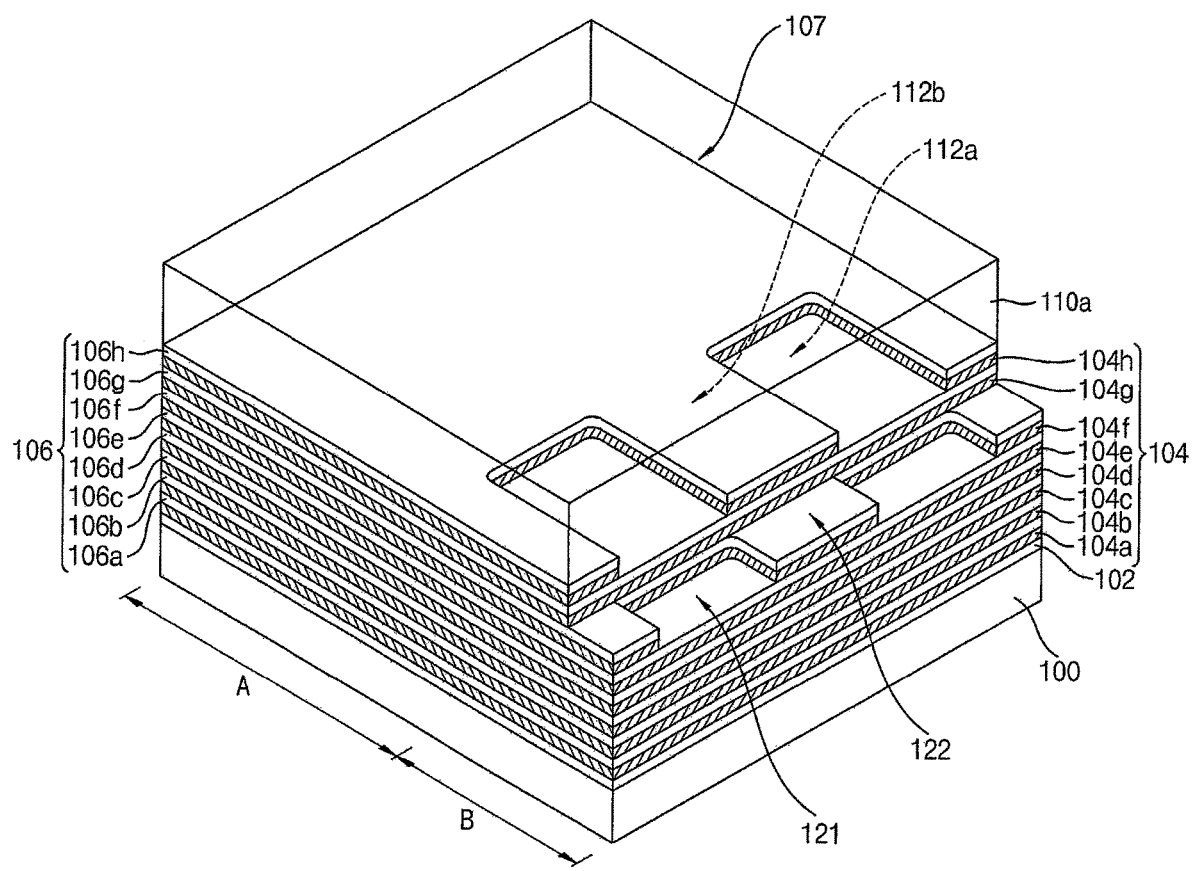
Figure 7:
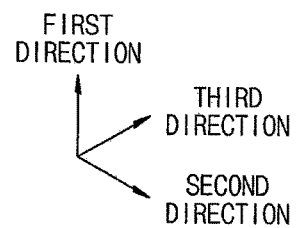
Figure 8:
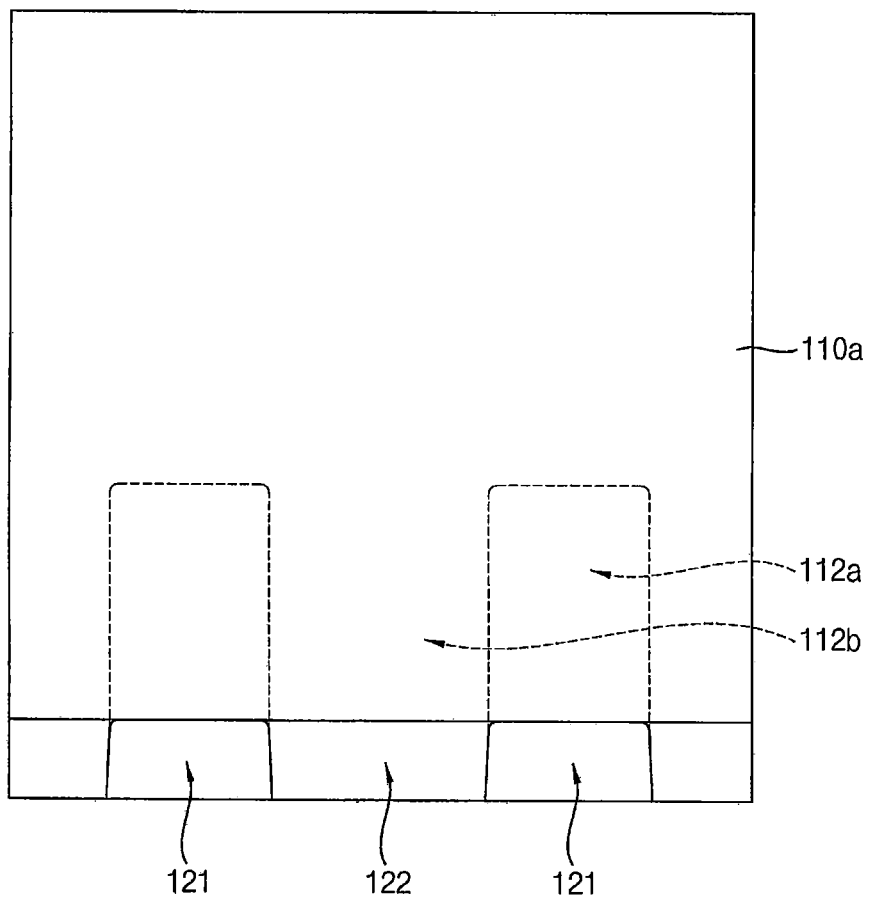

Referring to FIGS. 7 and 8, upper two stacked insulation layers 106 and upper two stacked sacrificial layers 104 exposed by the first photoresist pattern 110a may be etched.

When eight insulating layers 106 and eight sacrificial layers 104 are stacked in the mold structure 107, the insulation layers 106g and 106f and the sacrificial layers 104g and 104f under the lower step portion 112a disposed at seventh and sixth levels and the insulation layers 106h and 106g and the sacrificial layers 104h and 104g under the upper step portion 112b disposed at eighth and seventh levels may be etched.

A first preliminary pad region 121 and a second preliminary pad region 122 may be formed at fifth and sixth levels, respectively, by the etching process. An upper surface of the second preliminary pad region 122 may be higher than that of the first preliminary pad region 121 by a height of one level. In a plan view, the first preliminary pad region 121 may have a shape of a rectangle, however, ones of corners of the rectangle, which may be close to the cell region A, may be rounded. That is, a sidewall of the second preliminary pad region 122 near the corners of the rectangular shape of the first preliminary pad region 121 that are close to the cell region A may not be bent sharply. In some embodiments, a portion of the sidewall of the second preliminary pad region 122 adjacent the rounded corner of the rectangular shape of the first preliminary pad region 121 may have a curved shape as illustrated in FIG. 8.

Figure 9:
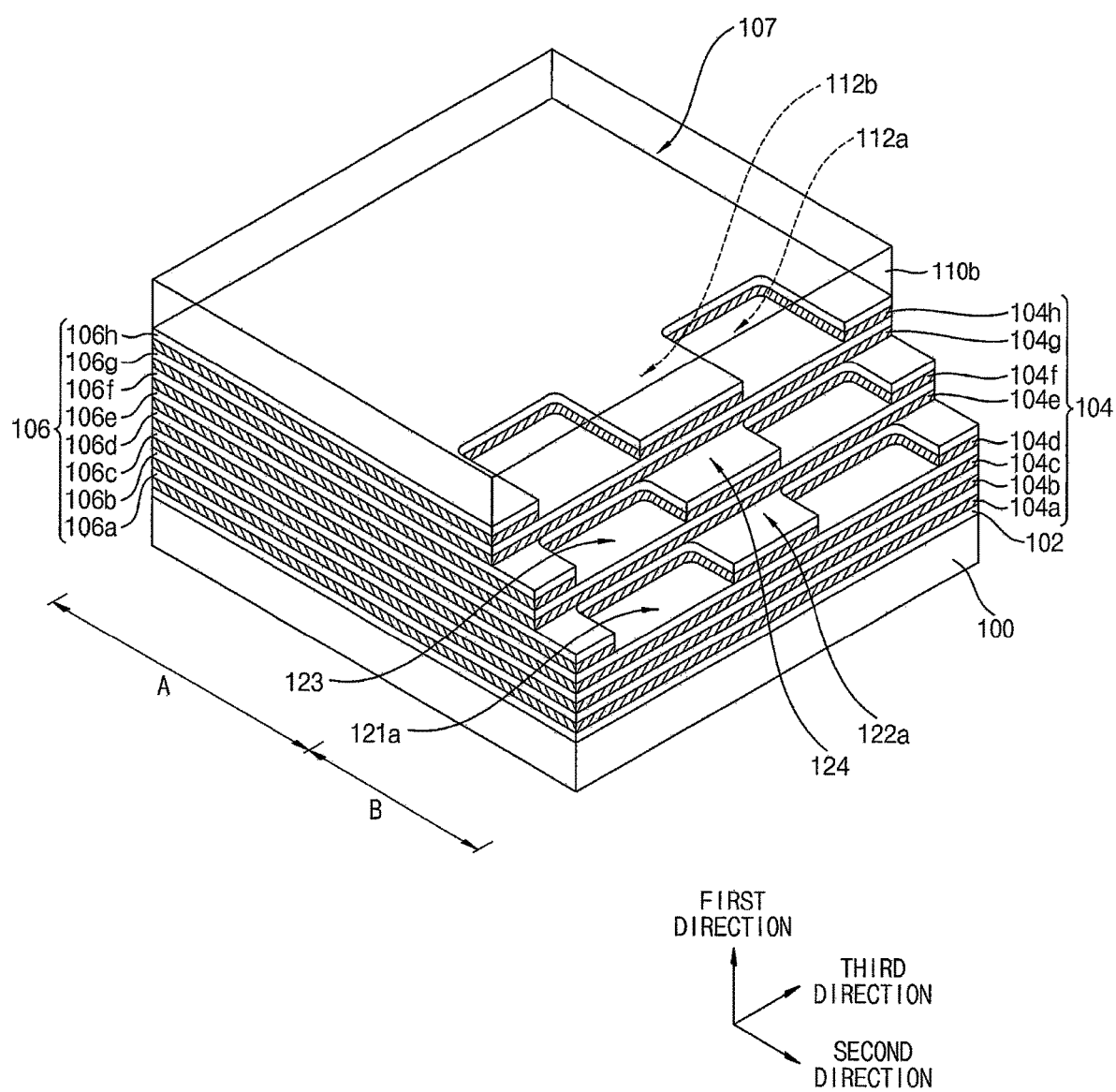
Figure 10:
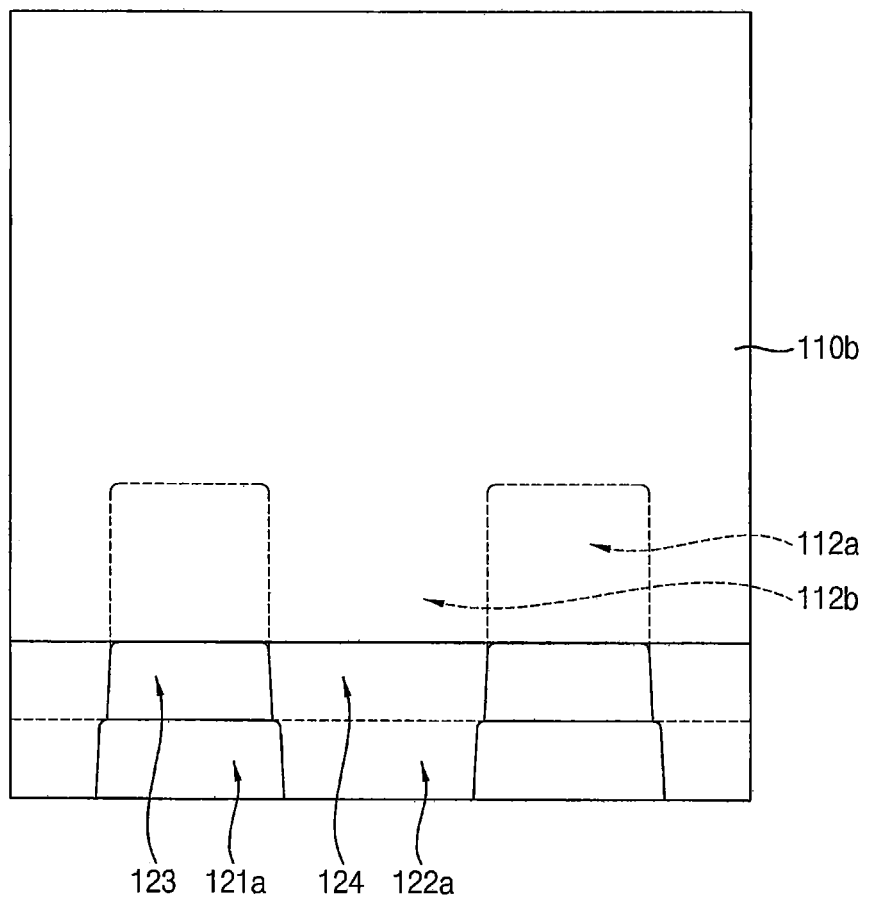

Referring to FIGS. 9 and 10, the first photoresist pattern 110a may be partially removed by a trimming process to form a second photoresist pattern 110b. Upper two stacked insulation layers 106 and upper two stacked sacrificial layers 104 exposed by the second photoresist pattern 110b may be etched.

Particularly, the second photoresist pattern 110b may have a width in the second direction less than a width of the first photoresist pattern 110a in the second direction. Thus, an area of the mold structure 107 exposed by the second photoresist pattern 110b may be greater than that of the mold structure 107 exposed by the first photoresist pattern 110a. An upper surface of the second photoresist pattern 110b may be lower than that of an upper surface of the first photoresist pattern 110a.

In example embodiments, the exposed portion of the mold structure 107 may extend in the third direction. A width of the exposed portion in the second direction may be substantially twice the width of the pad region in the second direction subsequently formed.

When eight insulating layers 106 and eight sacrificial layers 104 are stacked in the mold structure 107, the insulation layers 106g and 106f and the sacrificial layers 104g and 104f under the lower step portion 112a disposed at the seventh and sixth levels and the insulation layers 106h and 106g and the sacrificial layers 104h and 104g under the upper step portion 112b disposed at the eighth and seventh levels may be etched to form a third preliminary pad region 123 and a fourth preliminary pad region 124 at the fifth and sixth levels, respectively. An upper surface of the fourth preliminary pad region 124 may be higher than that of the third preliminary pad region 123.

Also, the insulation layers 106e and 106d and the sacrificial layers 104e and 104d under the first preliminary pad region 121 disposed at the fifth and fourth levels and the insulation layers 106f and 106e and the sacrificial layers 104f and 104e under the second preliminary pad region 122 disposed at the sixth and fifth levels may be etched to form a first preliminary pad pattern 121a and a second preliminary pad pattern 122a at the fourth and third levels, respectively. An upper surface of the second preliminary pad pattern 122a may be higher than that of the first preliminary pad pattern 121a.

In a plan view, each of the third preliminary pad region 123 and the first preliminary pattern 121a may have a shape of a rectangle, however, ones of corners of the rectangle, which may be close to the cell region A, may be rounded. That is, a sidewall of each of the fourth preliminary pad region 124 and the second preliminary pad pattern 122a near the corners of the rectangular shape of each of the third preliminary pad region 123 and the first preliminary pattern 121a that are close to the cell region A may not be bent sharply as illustrated in FIGS. 10.

The third and fourth preliminary pad regions 123 and 124 may be formed by performing etching processes twice. The first and second preliminary pad patterns 121a and 122a may be formed by performing etching processes three times. Thus, widths of the first and second preliminary pad patterns 121a and 122a in the third direction, and widths of the third and fourth preliminary pad regions 123 and 124 in the third direction may be different from each other.

The number of the etching processes for forming the first preliminary pad pattern 121a may be greater than that of the etching process for forming the third preliminary pad region 123, and thus a width of the first preliminary pad pattern 121a in the third direction may be greater than a width of the third preliminary pad region 123 in the third direction. As the width of the first preliminary pad pattern 121a in the third direction increases, the width of the second preliminary pad region 123 in the third direction may decrease.

Figure 11:
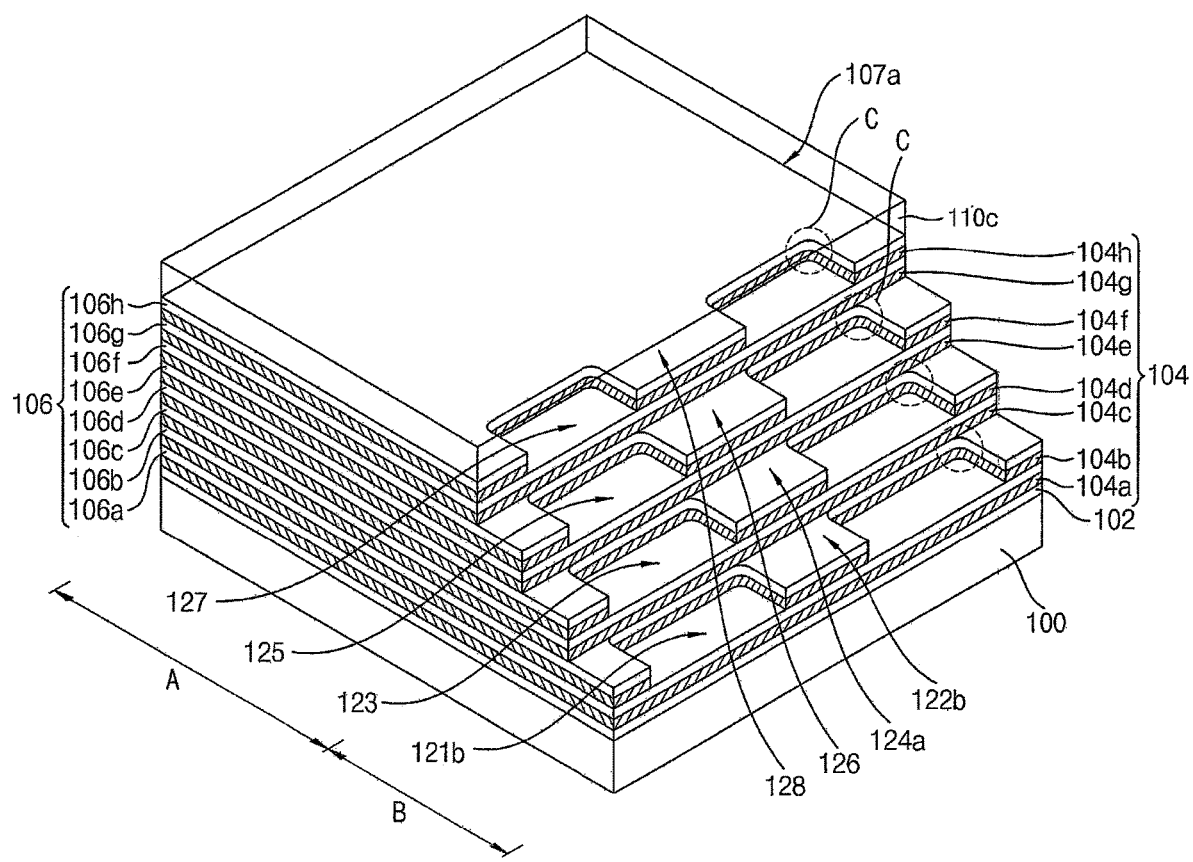
Figure 11:
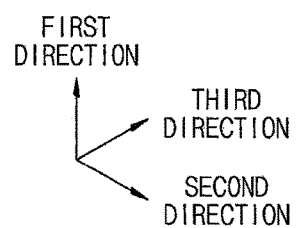
Figure 12:
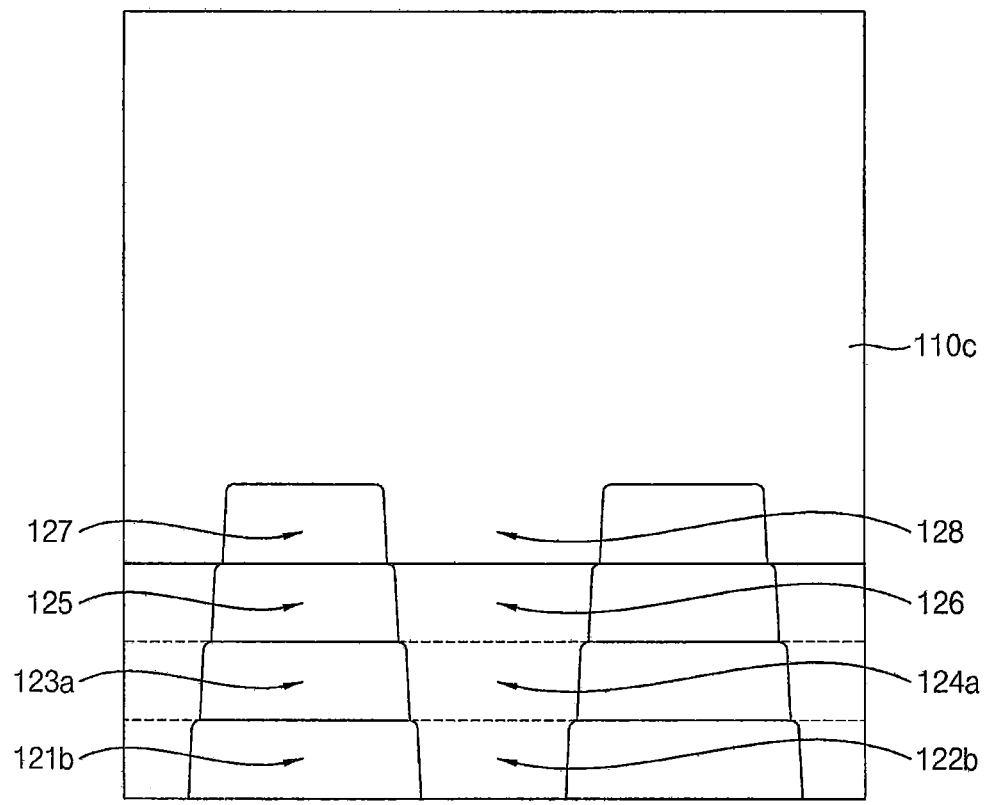

Referring to FIGS. 11 and 12, the second photoresist pattern 110b may be partially removed by a trimming process to form a third photoresist pattern 110c. Upper two stacked insulation layers 106 and upper two stacked sacrificial layers 104 exposed by the third photoresist pattern 110c may be etched.

Particularly, the third photoresist pattern 110c may have a width in the second direction less than a width of the second photoresist pattern 110b in the second direction. An area of the mold structure 107 exposed by the third photoresist pattern 110c may be greater than that of the mold structure 107 exposed by the second photoresist pattern 110b. An upper surface of the third photoresist pattern 110c may be lower than that of the upper surface of the second photoresist pattern 110b.

In example embodiments, the exposed portion may extend in the third direction. A width of the exposed portion in the second direction may be substantially three times the width of the pad region in the second direction subsequently formed.

When eight insulating layers 106 and eight sacrificial layers 104 are stacked in the mold structure 107, the insulation layers 106g and 106f and the sacrificial layers 104g and 104f under the lower step portion 112a disposed at the seventh and sixth levels and the insulation layers 106h and 106g and the sacrificial layers 104h and 104g under the upper step portion 112b disposed at the eighth and seventh levels may be etched to form a fifth preliminary pad region 125 and a sixth preliminary pad region 126 at the fifth and sixth levels, respectively. An upper surface of the sixth preliminary pad region 126 may be higher than that of the fifth preliminary pad region 125.

Also, the insulation layers 106e and 106d and the sacrificial layers 104e and 104d under the third preliminary pad region 123 disposed at the fifth and fourth levels and the insulation layers 106f and 106e and the sacrificial layers 104f and 104e under the fourth preliminary pad region 124 disposed at the sixth and fifth levels may be etched to form a third preliminary pad pattern 123a and a fourth preliminary pad pattern 124a at the third and fourth levels, respectively. An upper surface of the fourth preliminary pad pattern 124a may be higher than that of the third preliminary pad pattern 123a.

Further, the insulation layers 106c and 106b and the sacrificial layers 104c and 104b under the first preliminary pad pattern 121a disposed at third and second levels and the insulation layers 106d and 106c and the sacrificial layers 104d and 104c under the second preliminary pad pattern 122a disposed at the fourth and third levels may be etched to form a first preliminary pad pattern 121b and a second preliminary pad pattern 122b at the first and second levels, respectively. An upper surface of the second preliminary pad pattern 122b may be higher than that of the first preliminary pad pattern 121b.

The third photoresist pattern 110c may be removed, and the lower and upper step portions 112a and 112b may be referred to as seventh and eighth preliminary pad regions 127 and 128, respectively, disposed at the seventh and eighth levels, respectively.

Upper surfaces of the first, second, third and fourth preliminary pad patterns 121b, 122b, 123a and 124a, and the fifth, sixth, seventh and eighth preliminary pad regions 125, 126, 127 and 128 may have different heights in the first direction, which may increase in this order.

In a plan view, each of the fifth preliminary pad region 125, the third preliminary pad pattern 123a and the first preliminary pattern 121b may have a shape of a rectangle, however, ones of corners of the rectangle, which may be close to the cell region A, may be rounded as shown in regions C in FIG. 11. That is, a sidewall of each of the sixth preliminary pad region 126, the fourth preliminary pad pattern 124*a* and the second preliminary pad pattern 122*b* near the corners of the rectangular shape of each of the fifth preliminary pad region 125, the third preliminary pad pattern 123*a* and the first preliminary pattern 121*b* that are close to the cell region A may not be bent sharply.

The number of the etching process for forming the first, second, third and fourth preliminary pad patterns 121*b*, 122*b*, 123*a* and 124*a*, and the fifth, sixth, seventh and eighth preliminary pad regions 125, 126, 127 and 128 may be different from each other, and thus widths thereof in the third direction may be different from each other.

Particularly, the first and third preliminary pad patterns 121*b* and 123*a*, and the fifth and seventh preliminary pad regions 125 and 127 may be formed from the lower step portion 112*a*. As the number of etching processes performed thereon increases, the widths thereof in the third direction, i.e., the widths of the first and third preliminary pad patterns 121*b* and 123*a* in the third direction, and the fifth and seventh preliminary pad regions 125 and 127 in the third direction may increase in this order. Thus, the first preliminary pad pattern 121*b* may have a greatest width in the third direction, and the seventh preliminary pad region 127 may have a smallest width in the third direction. The second and fourth preliminary pad patterns 122*b* and 124*a*, and the sixth and eighth preliminary pad regions 126 and 128 may be formed from the upper step portion. The widths of the second and fourth preliminary pad patterns 122*b* and 124*a*, and the sixth and eighth preliminary pad regions 126 and 128 may decrease in this order. Thus, the second preliminary pad pattern 122*b* may have a smallest width in the third direction, and the eighth preliminary pad region 128 may have a greatest width in the third direction.

Thus, a preliminary step mold structure 107*a* including the first, second, third and fourth preliminary pad patterns 121*b*, 122*b*, 123*a* and 124*a*, and the fifth, sixth, seventh and eighth preliminary pad regions 125, 126, 127 and 128 on the wiring region B may be formed.

Figure 13:
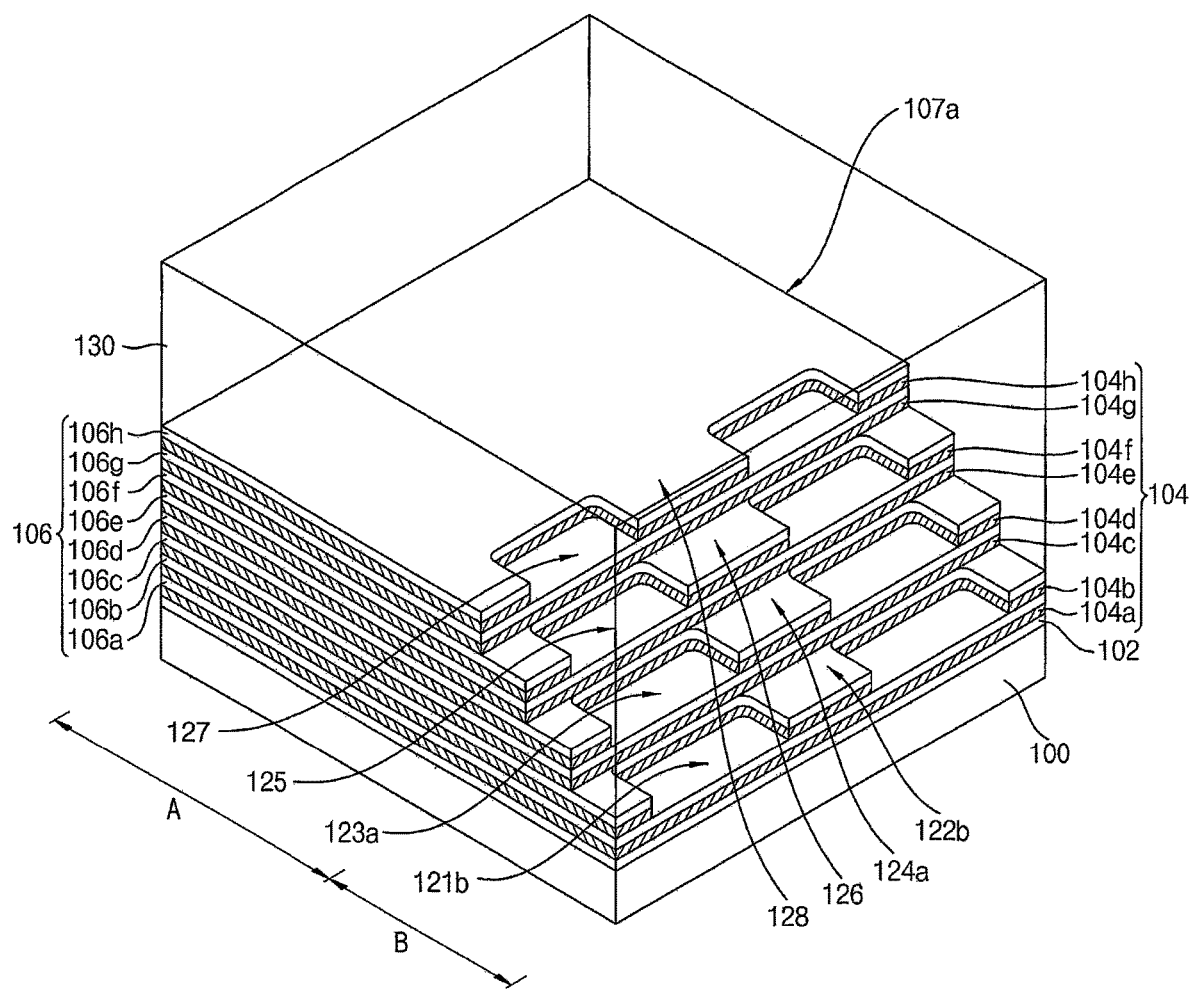
Figure 13:
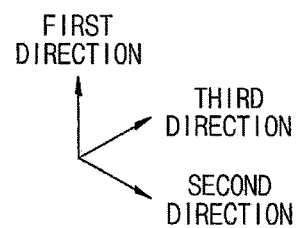

Referring to FIG. 13, an insulating interlayer 130 may be formed on the preliminary step mold structure 107*a*.

In example embodiments, the insulating interlayer 130 may entirely cover the preliminary step mold structure 107*a*. In example embodiments, an upper surface of the insulating interlayer 130 may be planarized by, e.g., a chemical mechanical polishing (CMP) process.

In the preliminary step mold structure 107*a*, the first, second, third and fourth preliminary pad patterns 121*b*, 122*b*, 123*a* and 124*a*, and the fifth, sixth, seventh and eighth preliminary pad regions 125, 126, 127 and 128 may be at different levels, and thus the insulating interlayer 130 may include voids therein. The voids may be generated at boundaries between the first, second, third and fourth preliminary pad patterns 121*b*, 122*b*, 123*a* and 124*a*, and the fifth, sixth, seventh and eighth preliminary pad regions 125, 126, 127 and 128.

However, the sidewall of each of the eighth preliminary pad region 128, the sixth preliminary pad region 126, the fourth preliminary pad pattern 124*a* and the second preliminary pad pattern 122*b* near the corners of the rectangular shape of each of the seventh preliminary pad region 127, the fifth preliminary pad region 125, the third preliminary pad pattern 123*a* and the first preliminary pattern 121*b* that are close to the cell region A may not be bent sharply, and thus the insulating interlayer 130 may be easily filled therein so that no void may be formed.

Figure 14:
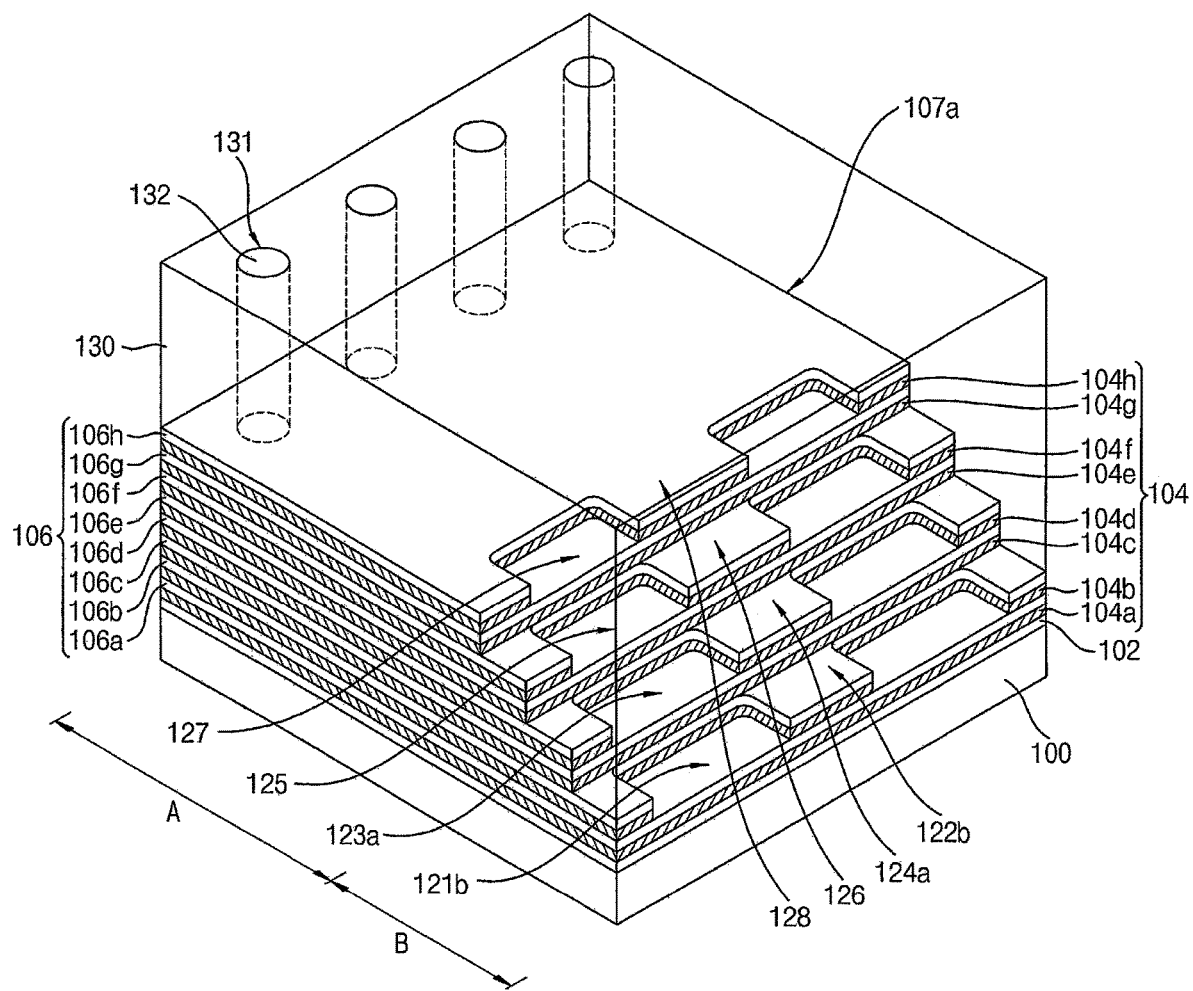
Figure 14:
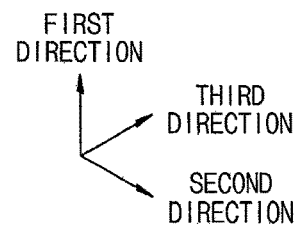

Referring to FIG. 14, a channel hole 131 may be formed through the insulating interlayer 130 and the preliminary step mold structure 107*a* in the cell region A. A vertical channel structure 132 may be formed in the channel hole 131.

In some embodiments, a hard mask (not shown) may be formed on the insulating interlayer 130. The insulating interlayer 130 and the preliminary step mold structure 107*a* may be etched using the hard mask as an etching mask to form the channel hole 131. An upper surface of the substrate 100 may be partially exposed by the channel hole 131. The hard mask may be removed after forming the channel hole 131.

Referring again to FIGS. 3A and 3B, the vertical channel structure 132 may be formed to include a channel 172, a charge storage structure 174 including a tunnel insulation layer, a charge storage layer and a blocking dielectric layer, and a filling insulation pattern 176. In example embodiments, a semiconductor pattern 170 may be formed between the substrate 100 exposed by the channel hole 131 and the vertical channel structure 132.

In example embodiments, the semiconductor pattern 170 may be formed at a lower portion of the channel hole 131. For example, the semiconductor pattern 170 may be formed by a selective epitaxial growth (SEG) process using the top surface of the substrate 100 exposed by the channel hole 131 as a seed. In some embodiments, an amorphous silicon layer filling the lower portion of the channel hole 131 may be formed, and a laser epitaxial growth (LEG) process or a solid phase epitaxy (SPE) process may be performed thereon to form the semiconductor pattern 170.

The blocking dielectric layer, the charge storage layer and the tunnel insulation layer may be sequentially formed on a sidewall of the channel hole 131, and upper surfaces of the semiconductor pattern 170 and the insulating interlayer 130. The blocking dielectric layer, the charge storage layer and the tunnel insulation layer may be etched back to form a charge storage structure 174 including the blocking dielectric layer, the charge storage layer and the tunnel insulation layer.

A channel layer may be formed on the tunnel insulation layer, the semiconductor pattern 170 and the insulating interlayer 130, and a filling insulation layer may be formed to fill a remaining portion of the channel hole 131. Upper surfaces of the channel layer and the filling insulation layer may be planarized until the upper surface of the insulating interlayer 130 may be exposed. Thus, the vertical channel structure 132 may be formed on the semiconductor pattern 170.

The blocking dielectric layer, the charge storage layer and the tunnel insulation layer may be formed by, for example, a CVD process, a PE-CVD process and/or an ALD process.

In example embodiments, the channel layer may be formed of doped polysilicon or amorphous silicon. In some embodiments, the channel layer may be formed of polysilicon or amorphous silicon, and then a heat treatment or a laser beam irradiation may be further performed on the channel layer. In this case, the channel layer may be transformed to include single crystalline silicon. The filling insulation layer may be formed of, e.g., silicon oxide or silicon nitride. The channel layer and the filling insulation layer may be formed by, for example, a CVD process, a PECVD process, an ALD process, a PVD process, a sputtering process, etc.

In example embodiments, the formation of the filling insulation layer may be omitted, and the channel 172 may have a pillar shape filling the channel hole 131.

A pad pattern 178 capping an upper portion of the channel hole 131 may be formed. In example embodiments, an upper portion of the vertical channel structure 132 may be partially removed by, e.g., an etch-back process, to form a recess, and the pad pattern 178 may be formed to fill the recess. The pad pattern 178 may be formed of, e.g., polysilicon.

Figure 15:
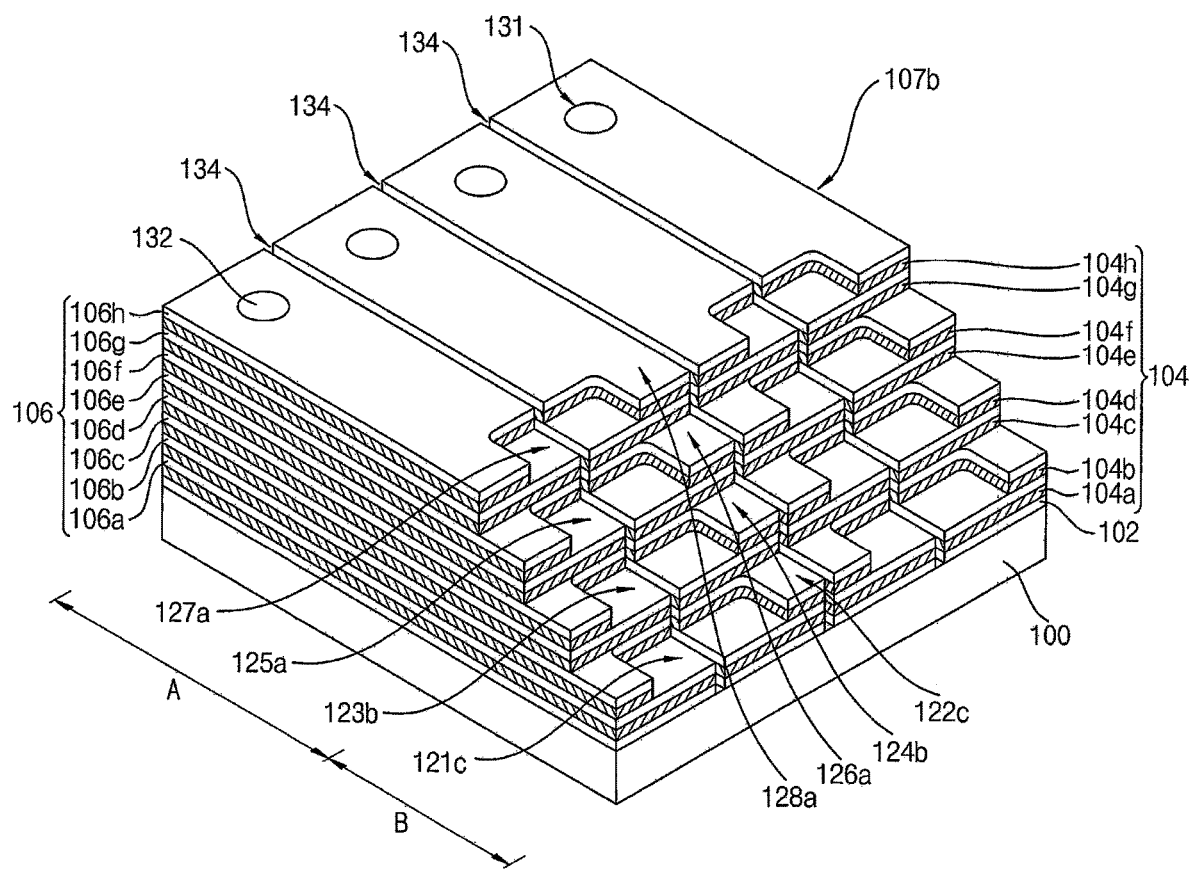
Figure 15:
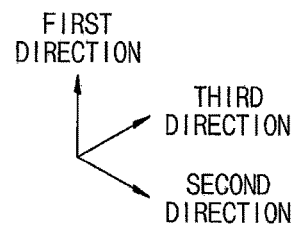
Figure 16:
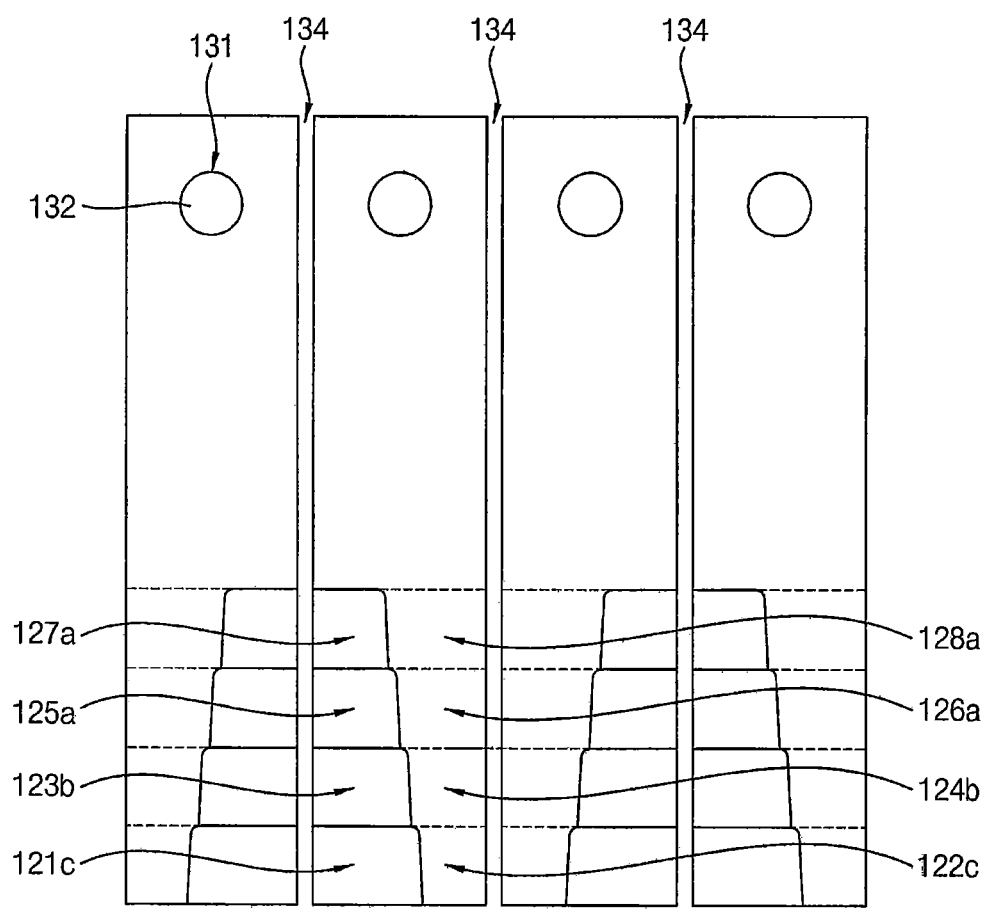

Referring to FIGS. 15 and 16, the insulating interlayer, 130 the preliminary step mold structure 107a and the pad insulation layer 102 may be etched to form openings 134 exposing an upper surface of the substrate 100. In example embodiments, a plurality of openings 134 may be formed along the third direction. The preliminary step mold structure 107a may be divided into a plurality of step mold structures 107b by the plurality of openings 134. Each of the openings 134 may extend in the second direction through a central portion of the preliminary pad regions in the preliminary step mold structure 107a in the third direction. For convenience of descriptions, the insulating interlayer 130 is omitted in FIGS. 15 and 16.

In some embodiments, a hard mask (not shown) may be formed on the insulating interlayer 130, and the insulating interlayer 130, the preliminary step mold structure 107a and the pad insulation layer 102 may be anisotropically etched using the hard mask as an etching mask to form the opening 134.

Thus, the preliminary pad region at each level may be divided into pad regions by the openings 134. The preliminary step mold structure 107a may be transformed into the step mold structures 107b including the pad regions spaced apart from each other by the opening 134. In example embodiments, the step mold structure 107b may include first to eighth pad regions 121c, 122c, 123b, 124b, 125a, 126a, 127a, 128a on the wiring region B. The step mold structure 107b may extend in the second direction, and a plurality of step mold structures 107b may be arranged in the third direction.

Neighboring ones of the step mold structures 107b in the third direction may be symmetric with respect to the opening 134 therebetween as illustrated in FIG. 15. That is, one of the step mold structures 107b may include the first, third, fifth and seventh pad regions 121c, 123b, 125a and 127a disposed at a right portion thereof, and another one of the step mold structures 107b adjacent the one of the step mold structures 107b in the third direction may include the first, third, fifth and seventh pad regions 121c, 123b, 125a and 127a disposed at a left portion in the third direction thereof.

In the step mold structure 107b, widths of the pad regions in the third direction disposed at (n-1)-th levels (n is an even number equal to or greater than 2) may decrease, in some embodiments may gradually decrease, from a bottom level toward a top level, and widths of the pad regions in the third direction disposed at n-th levels may increase, in some embodiments may gradually increase, from a bottom level toward a top level.

Each of the pad regions disposed at the (n-1)-th levels may have a rounded corner at a portion of a boundary area between the pad region disposed at each (n-1)-th level and the pad region disposed at each n-th level that is closest to the cell region A.

Figure 17:
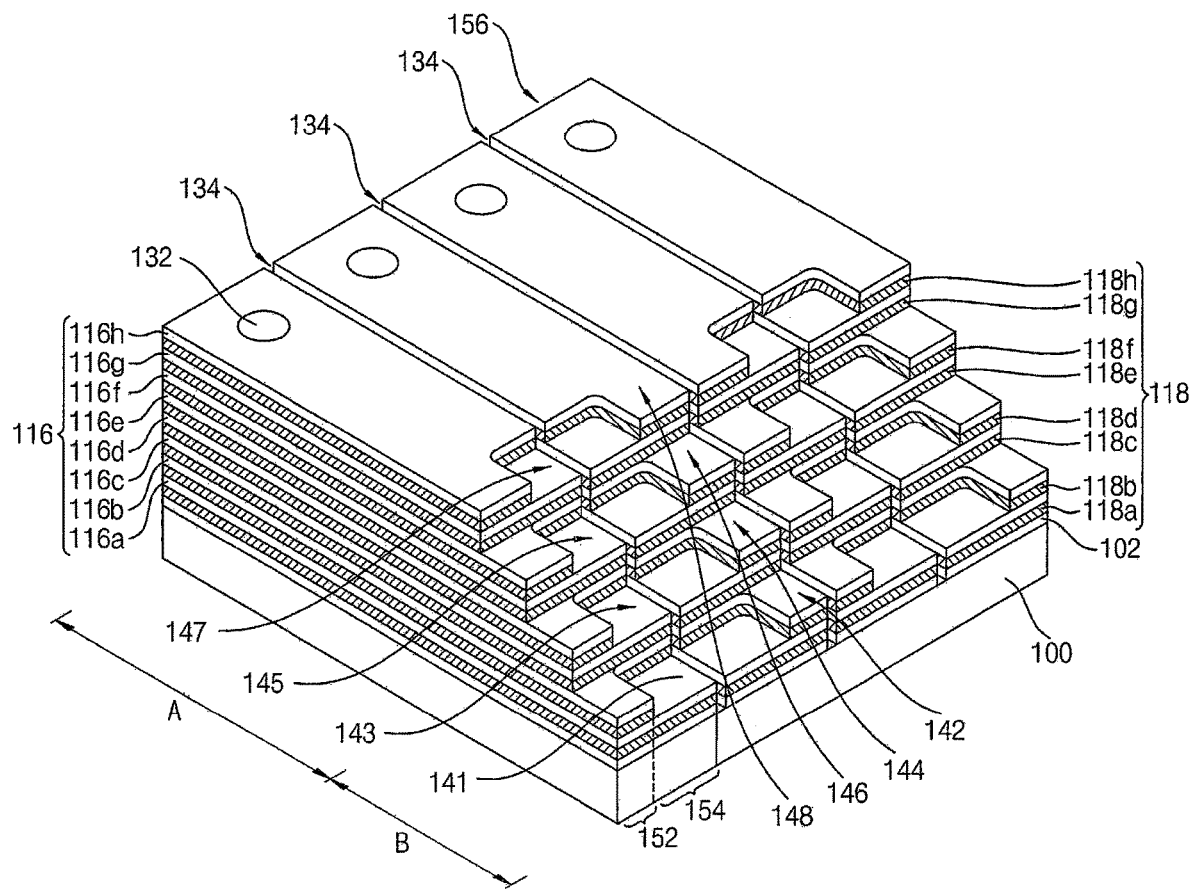
Figure 17:
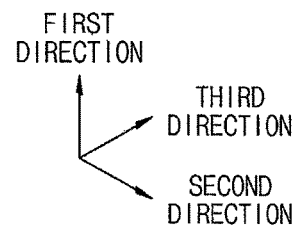

Referring to FIG. 17, the sacrificial layers 104 exposed by the openings 134 may be removed to form gaps. A conductive material may fill the gaps, so that a gate line structure 150, a first step structure 152 and a second step structure 154 may be formed.

In example embodiments, the sacrificial layers 104 may be isotropically etched using an etchant, e.g., phosphoric acid that may have an etching selectivity between silicon nitride and silicon oxide. Thus, the gaps may be formed between neighboring ones of the insulation layers 106 in the first direction. The blocking dielectric layer may be partially exposed by the gaps. In some example embodiments, a sidewall of the semiconductor pattern 170 may be exposed by a lowermost one of the gaps.

A first conductive layer may be formed to fill the gaps and at least partially fill the openings 134. The first conductive layer may be formed of a metal, e.g., tungsten, aluminum, copper, titanium or tantalum, or a nitride of the above metal. In example embodiments, the first conductive layer may be formed of tungsten.

In example embodiments, the first conductive layer may be formed to have a multi-layered structure including a barrier layer and a metal layer. The metal layer may include, e.g., a metal nitride. The first conductive layer may be formed by, for example, a CVD process, a PECVD process, an ALD process, a PVD process, a sputtering process, etc.

In example embodiments, before forming the first conductive layer, an additional blocking layer (not illustrated) including, e.g., a metal oxide may be formed on inner walls of the gaps.

The first conductive layer on an inner surface of the opening 134 and an upper surface of the substrate 100 may be isotropically etched to form a conductive pattern in each gap.

A plurality of conductive patterns may be formed to serve as gate lines 116 (e.g., 116a, 116b, 116c, 116d, 116e, 116f, 116g and 116h) and extended gate lines 118 (e.g., 118a, 118b, 118c, 118d, 118e, 118f, 118g and 118h). The insulation layer 106 may be formed between the conductive patterns in the first direction.

The gate line structure 150 including the gate lines 116 and the insulation layers 106 alternately stacked may be formed on the cell region A of the substrate 100. A first step pattern structure 152 and a second step pattern structure 154 may be formed on the wiring region B of the substrate 100. Each of the first and second step pattern structures 152 and 154 may include the extended gate lines 118 and the insulation layers 106 alternately stacked, and the extended gate line 118 may contact an edge portion of the gate line 116 in the second direction. The gate line structure 150 and the first and second step pattern structures 152 and 154 may be an integral structure serving as a gate structure 156. The gate structure 156 may include the gate line structure 150 and the first and second step pattern structures 152 and 154.

The gate lines 116 may include a GSL, word lines and an SSL. The GSL, the word lines and the SSL may be spaced apart from each other in the first direction on the substrate 100. For example, a lowermost one 116a of the gate lines 116 may serve as the GSL. An uppermost one 116h of the gate lines 116 may serve as the SSL. Intermediate ones 116b to 116g of the gate lines 116 between the GSL and the SSL may serve as the word lines.

Each step layer of the first step pattern structure 152 may include two extended gate lines 118 sequentially stacked in the first direction. An n-th one of the extended gate lines 118 (n is an even number equal to or greater than 2) from the upper surface of the substrate 100 (i.e., the n-th extended gate line) may be disposed at an upper portion of each step layer in the first step pattern structure 152. That is, a protruding portion of the n-th extended gate line in the second direction, e.g., each of the protruding portions of the second, fourth, sixth and eighth extended gate lines 118b, 118d 118f and 118h in the second direction may serve as a pad region for contacting a first contact plug (e.g., 160a in FIG. 18). In the first step pattern structure 152, a plurality of pad regions e.g., second, fourth, sixth and eighth pad regions 142, 144, 146 and 148 may be defined from the upper surface of the substrate 100 in the first direction.

Each step layer of the second step pattern structure 154 may include two extended gate lines 118 sequentially stacked in the first direction. An (n-1)-th one of the extended gate lines 118 (n is an even number equal to or greater than 2) from the upper surface of the substrate 100 (i.e., the (n-1)-th extended gate line) may be disposed at an upper portion of each step layer in the second step pattern structure 154. That is, a protruding portion of the (n-1)-th extended gate line in the second direction, e.g., each of the protruding portions of the first, third, fifth and seventh extended gate lines 118a, 118c 118e and 118g in the second direction may serve as a pad region for contacting a second contact plug (e.g., 160b in FIG. 18). In the second step pattern structure 154, a plurality of pad regions, e.g., first, third, fifth and seventh pad regions 141, 143, 145 and 147 may be defined from the upper surface of the substrate 100 in the first direction.

Thus, the gate line structure 150 may contact the first and second step pattern structures 152 and 154. The first and second step pattern structures 152 and 154 may be arranged in the third direction and may directly contact each other. Each of the first and second step pattern structures 152 and 154 may extend in the second direction from the edge portion of the gate line structure 150 in the second direction.

The gate line structure 150 may have a first width W1 in the third direction. An integral structure including the first and second step pattern structures 152 and 154 contacting the gate line structure 150 may have the first width W1 in the third direction. That is, the gate structure 156 may have the first width W1 in the third direction.

In the second step pattern structures 154, widths of the pad regions in the third direction may decrease (e.g., gradually decrease) from a bottom level toward a top level, while of the pad regions widths in the third direction may increase (e.g., gradually increase) from a bottom level toward a top level.

Each of the pad regions of the second step pattern structure 154 may have a rounded corner at a boundary area between the first and second step pattern structures 152 and 154, particularly, at a portion of the boundary area between the first and second step pattern structures 152 and 154 that is closest to the gate line structure 150. Thus, a sidewall of the first step pattern structure 152 near the portion of the boundary area between the first and second step pattern structures 152 and 154 that is closest to the gate line structure 150 may not be bent sharply.

Figure 18:
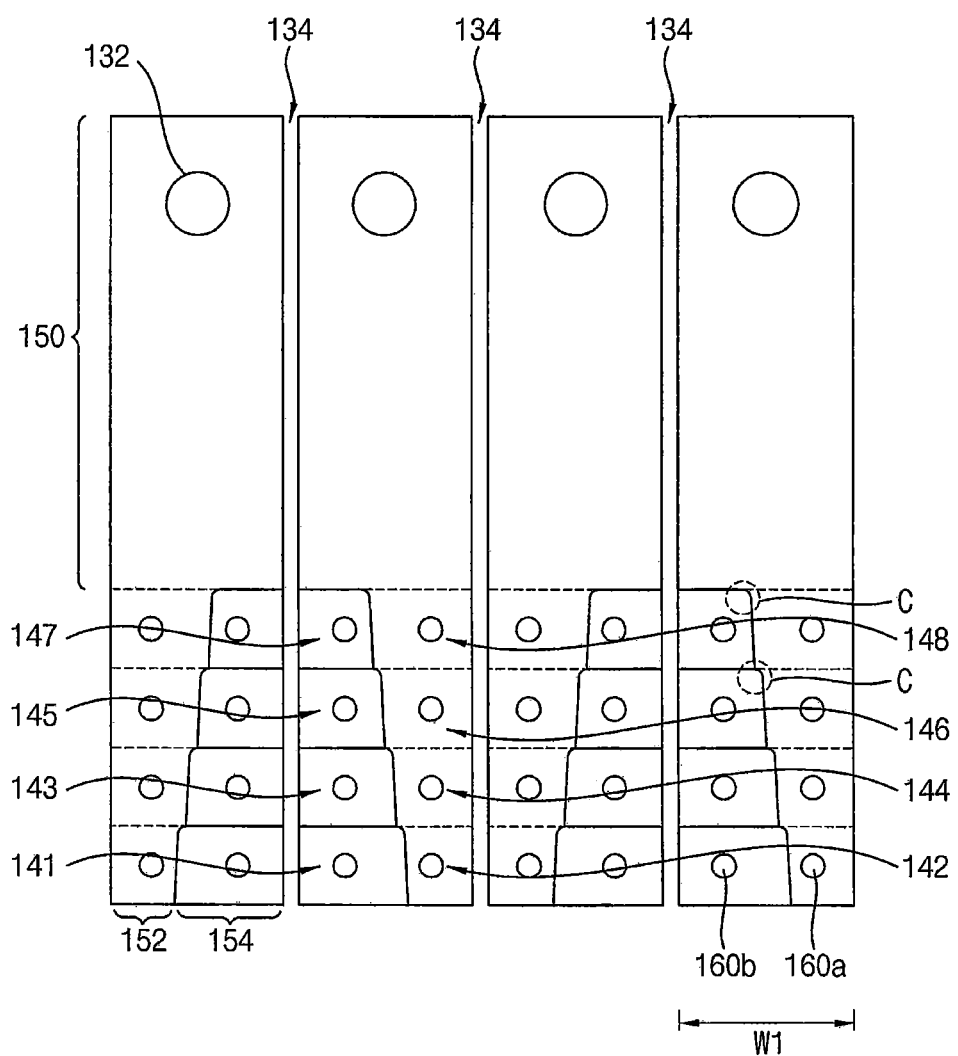

Referring to FIG. 18, an impurity region (not shown) may be formed at an upper portion of the substrate 100 exposed by the opening 134. An insulation pattern (not shown) may be formed on the impurity region to fill the opening 134. The first contact plugs 160a and second contact plugs 160b contacting the pad regions of the extended gate lines 118 may be formed through the insulating interlayer 130.

The impurity region may extend in the second direction, and may serve as a common source line (CSL) of the vertical memory device. The insulation pattern may be formed of, e.g., silicon oxide.

In example embodiments, the insulation pattern may be formed on the sidewall of the opening 134, and a conductive material may be formed to fill the opening 134 to form the CSL contacting the impurity region.

In some embodiments, an etching mask (not shown) may be formed on the insulating interlayer 130 and the insulation pattern. The insulating interlayer 130 may be etched using the etching mask to form a contact hole exposing the pad region of each of the extended gate lines. A conductive layer may be formed to fill the contact hole, and an upper surface of the conductive layer may be planarized until an upper surface of the insulating interlayer 130 may be exposed. Thus, the first contact plugs 160a may be formed on the pad regions of the first step pattern structure 152, respectively, and the second contact plug 160b may be formed on the pad regions of the second step pattern structure 154, respectively.

The pad regions of the second step pattern structure 154 may have different widths at the respective levels, so that the second contact plugs 160b may be variously disposed on the pad regions, respectively. In example embodiments, in a plan view, the second contact plugs 160b may be arranged in the second direction or the third direction. In some example embodiments, in a plan view, the second contact plugs 160b may be arranged in a diagonal direction with respect to the second direction. In some example embodiments, in a plan view, the second contact plugs 160b may be arranged in a zig-zag pattern. In some example embodiments, in a plan view, the second contact plugs 160b may be disposed on a central portion of each of the pad regions.

In example embodiments, in a plan view, the first contact plugs 160a may be arranged in the second direction, in the third direction, or in a diagonal direction with respect to the second direction. In some example embodiments, in a plan view, the first contact plugs 160a may be arranged in a zig-zag pattern. Alternatively, in a plan view, the first contact plugs 160a may be disposed on a central portion of each of the pad regions.

Figure 19:
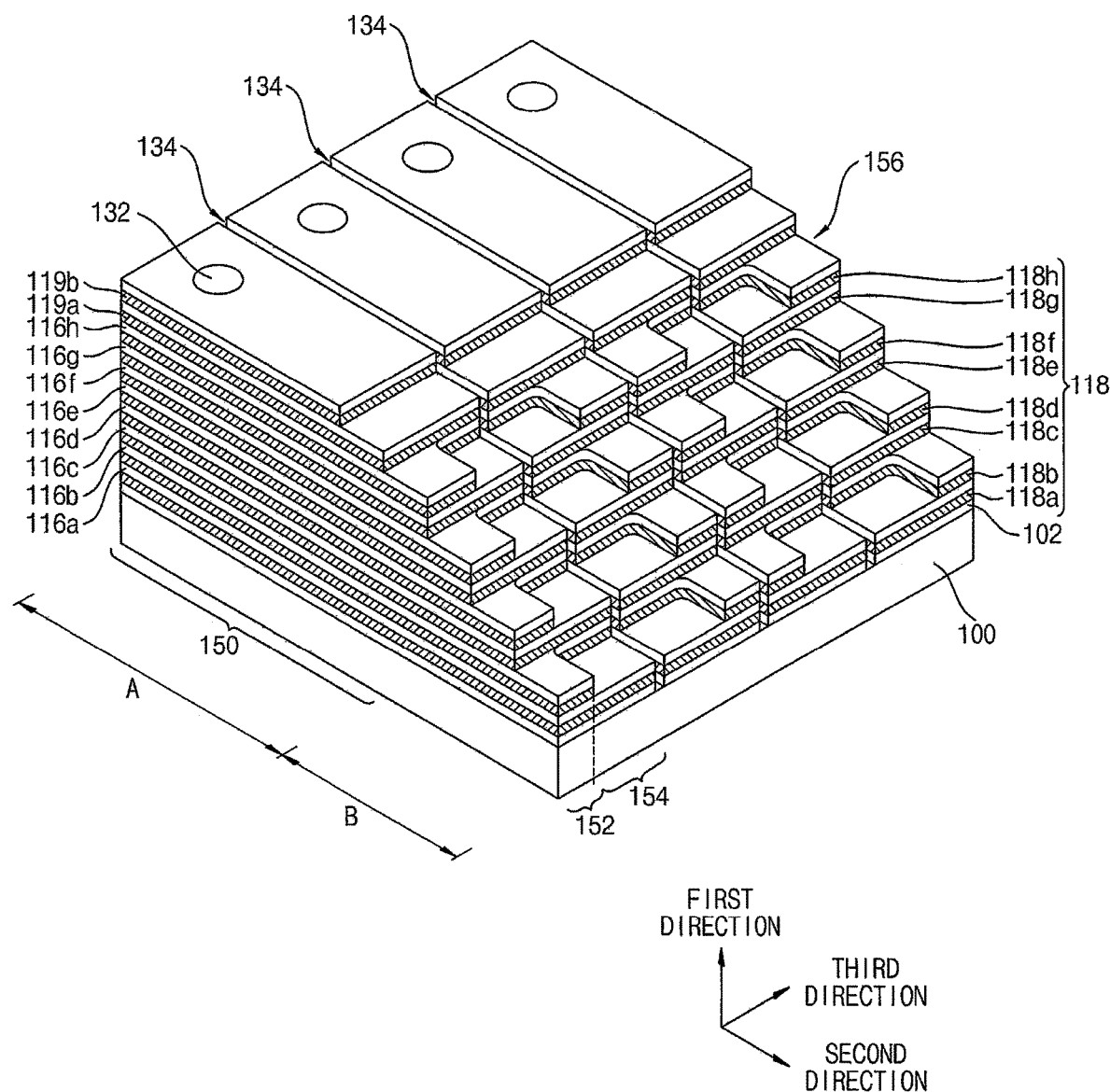
Figure 20:
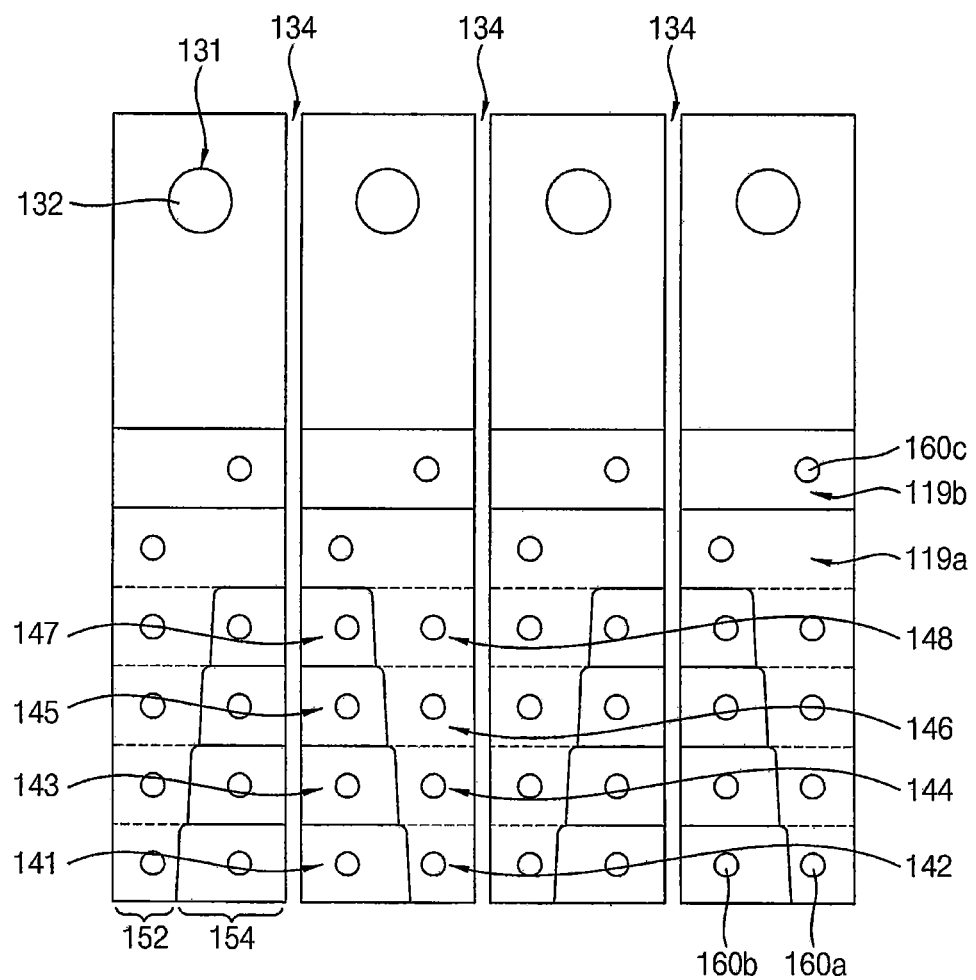

FIGS. 19 and 20 are a perspective view and a plan view, respectively, illustrating a vertical memory device in accordance with example embodiments.

The vertical memory device of FIG. 19 may have elements and/or structures substantially the same as or similar to those illustrated in FIGS. 1, 2, 3A and 3B, except for the shape of string selection lines (SSLs). Thus, like reference numerals are used to designate like elements, and detailed descriptions thereon are omitted herein. For convenience of descriptions, the illustration of some insulation layers and contact plugs is omitted in FIG. 19.

Referring to FIGS. 19 and 20, as shown in FIGS. 1, 2, 3A and 3B, the vertical channel structure 132 may be formed on the substrate 100 and may extend in the first direction from the substrate 100. The gate structure 156 may include the gate line structure 150, the first step pattern structure 152 and the second step pattern structure 154. The gate line structure 150 may surround the vertical channel structure 132.

The gate structure 156 may include a plurality of gate lines 116 serving as a GSL or word lines. String selection lines (SSLs) 119a and 119b may be formed on the gate structure 156.

In example embodiments, a first SSL 119a and a second SSL 119b may be sequentially stacked on the gate structure 156. The insulation layer 106 may be formed between the first SSL 119a and the second SSL 119b, and on the second SSL 119b.

Each of the first and second SSLs 119a and 119b may extend in the second direction. Each of the first and second SSLs 119a and 119b may have a first width W1 in the third direction, which may be substantially the same as a width of the gate structure 156 in the third direction.

An edge portion of the first SSL 119a in the second direction may be closer to the cell region A than an edge portion of an uppermost extended gate line 118h of the first step pattern structure 152 in the second direction. An uppermost pad region of the first step pattern structure 152 may not be overlapped with but exposed by the first SSL 119a as illustrated in FIG. 19.

A length of the second SSL 119b in the second direction may be less than a of the first SSL 119a length in the second direction. Thus, the edge portion of the first SSL 119b in the second direction may not be overlapped with but exposed by the second SSL 119a as illustrated in FIG. 19.

A material of the first and second SSLs 119a and 119b may be substantially the same as a material of the gate line 116 and the extended gate line 118.

The edge portions of the first and second SSLs 119a and 119b in the second direction may have shapes different from the shapes of the extended gate lines 118 of the first and second step pattern structures 152 and 154.

An insulating interlayer (not shown) may cover the vertical channel structure 132, the gate structure 156, and the first and second SSLs 119a and 119b.

The first contact plug 160a may extend through the insulating interlayer and contact the pad region of the extended gate line 118 of the first step pattern structure 152. The second contact plug 160b may extend through the insulating interlayer and contact the pad region of the extended gate line 118 of the second step structure 154. A third contact plug 160c may extend through the insulating interlayer and contact each of the first and second SSLs 119a and 119b.

Figure 21:
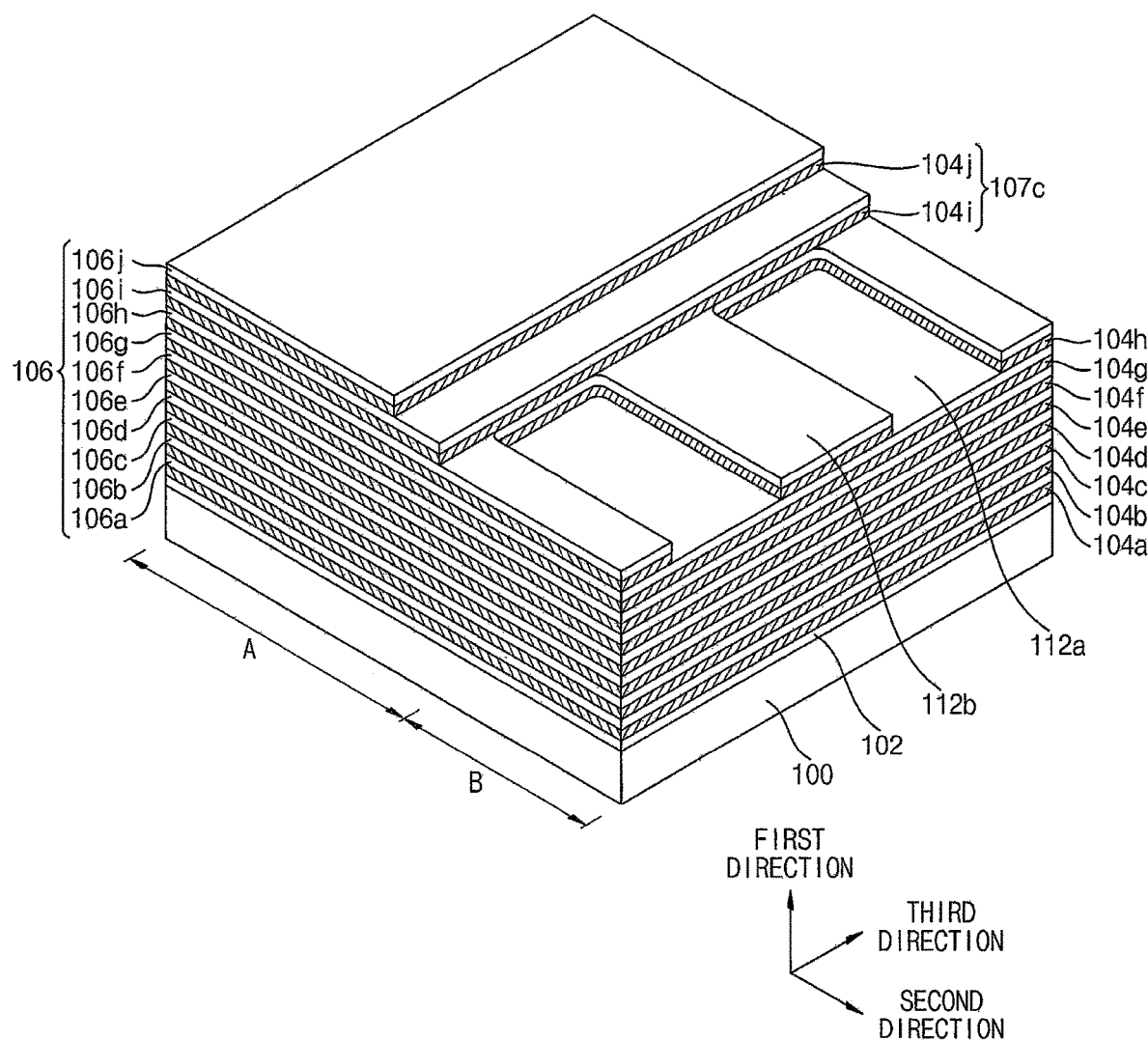

FIG. 21 is a perspective view illustrating a method of manufacturing a vertical memory device in accordance with example embodiments.

The method of manufacturing the vertical memory device may include processes the same as or similar to those illustrated with reference to FIGS. 4 to 18. Thus, like reference numerals refer to like elements, and detailed descriptions thereon are omitted herein.

Referring to FIG. 21, the pad insulation layer 102 may be formed on the substrate 100. The insulation layers 106 and the sacrificial layers 104 may be formed alternately and repeatedly on the pad insulation layer 102 to form the mold structure. The sacrificial layer 104 for forming an SSL may be formed at an upper portion of the mold structure.

In the wiring region A, the sacrificial layers 104 for forming the SSL and the insulation layers 106 may be etched to form a preliminary SSL mold pattern 107c.

The sacrificial layers 104 and the insulation layers 106 under the preliminary SSL mold pattern 107c may be partially etched to form a lower step portion 112a.

In some embodiments, a first photoresist pattern (not shown) may be formed on the mold structure by a photo process. The first photoresist pattern may expose a portion of the insulation layer in the wiring region B.

The insulation layer 106 and sacrificial layer 104 for forming the SSL may be etched using the first photoresist pattern as an etching mask. In example embodiments, when the SSL includes a first SSL and a second SSL, upper two stacked insulation layers 106 and upper two stacked sacrificial layers 105 may be etched as illustrated in FIG. 21.

The first photoresist pattern may be partially removed by a trimming process to form a trimmed first photoresist pattern. The trimmed first photoresist pattern may have a length in the second direction less than the length of the first photoresist pattern. An uppermost one of the insulation layers 106 and an uppermost one of the sacrificial layers 104 may be etched using the trimmed first photoresist pattern as an etching mask to form a preliminary SSL mold pattern 107c for forming the SSL. The preliminary SSL mold pattern 107c may have a stepped shape.

A second photoresist pattern (not shown) for forming a lower step portion and a upper step portion may be formed on the mold structure including the preliminary SSL mold pattern 107c. The second photoresist pattern may expose an upper surface of the mold structure under the preliminary SSL mold pattern 107c.

The uppermost one of the insulation layer 106 and the uppermost one of the sacrificial layer 104 may be etched using the second photoresist pattern as an etching mask to form a lower step portion 112a and an upper step portion 112b. The lower step portion 112a and the upper step portion 112b may be formed on the mold structure in the wiring region B. A plurality of the lower step portions 112a and a plurality of upper step portions 112b may be alternately disposed in the third direction Then, processes substantially the same as or similar to those illustrated with reference to FIGS. 6 to 16 are performed. Thus, the step mold structure including the SSL mold pattern may be formed.

Processes substantially the same as or similar to those illustrated with reference to FIGS. 17 to 18 may be performed, so that the sacrificial layers 104 of the step mold structure may be replaced with conductive patterns. Thus, as shown in FIG. 19, the gate structure 156 including the gate line structure 150 and the first and second step structures 152 and 154 may be formed. Also, the first and second SSLs 119a and 119b may be formed on the gate structure 156.

The first contact plug 160a and the second contact plug 160b may be formed on the pad regions of the first and second step pattern structures 152 and 154, respectively. A third contact plug 160c may be formed on each of the first and second SSLs 119a and 119b.

As described above, the vertical memory device, which may include the SSLs 119a and 119b and the gate lines 116 having different stepped shapes from each other, may be manufactured.

FIGS. 22, 23A, 23B and 23C are plan views and cross-sectional views illustrating a vertical memory device in accordance with example embodiments.

Figure 22:
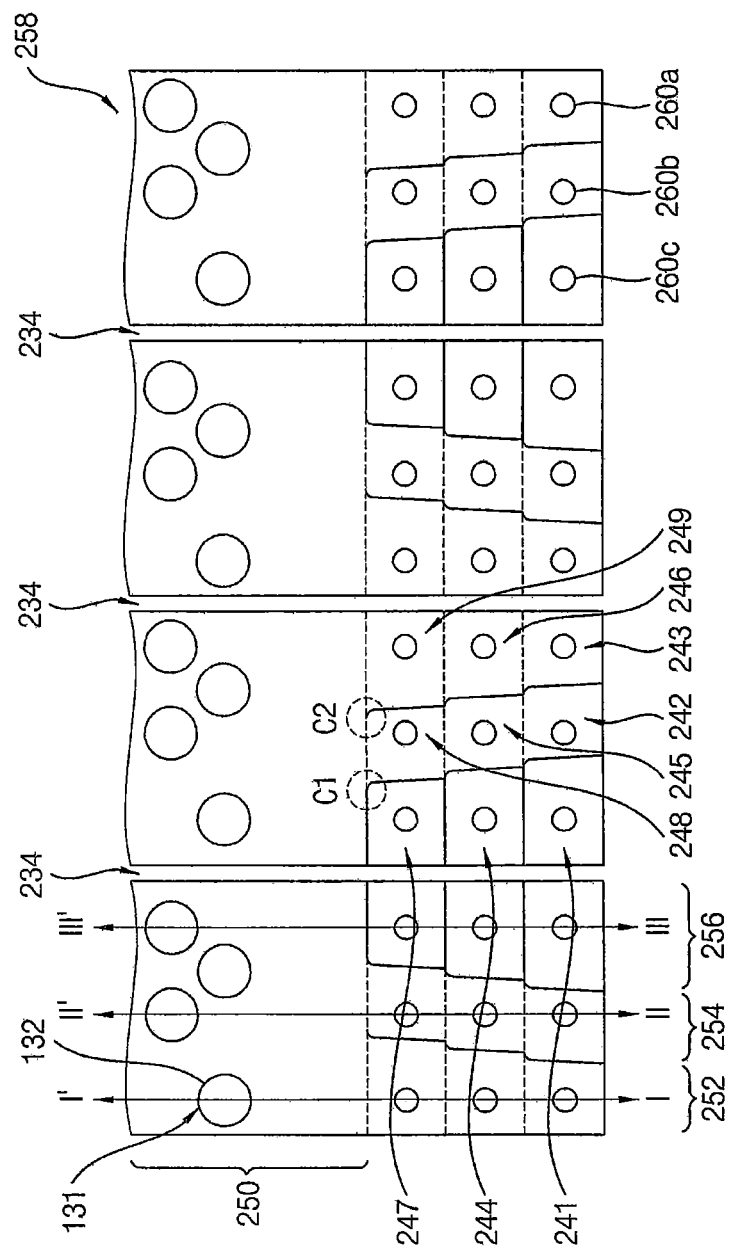
Figure 23A:
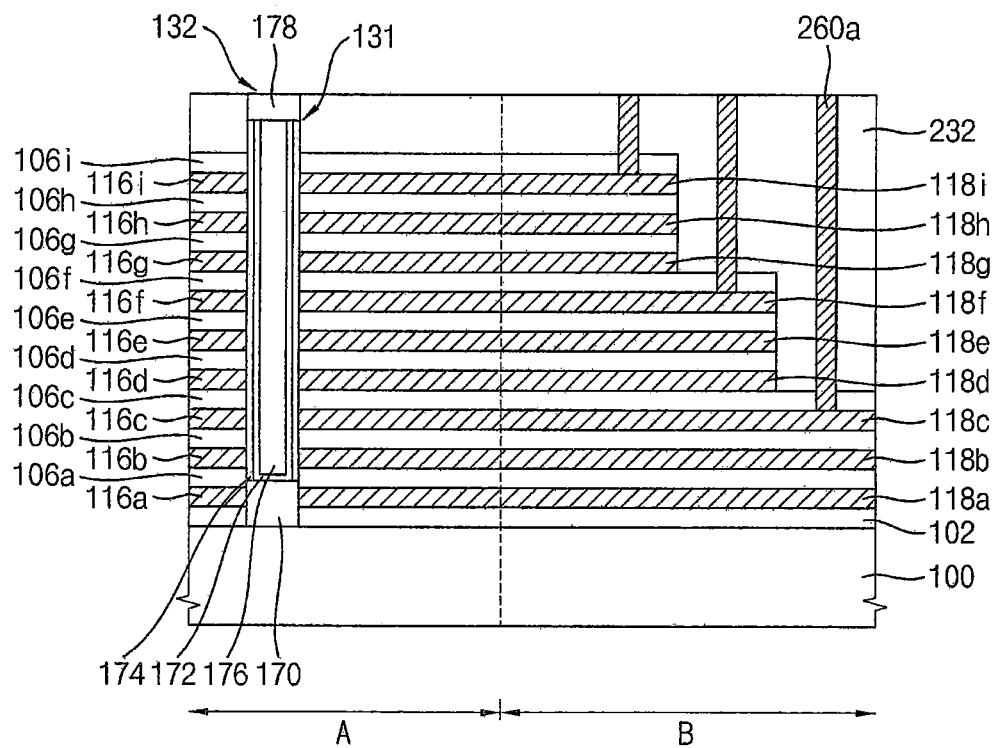
Figure 23B:
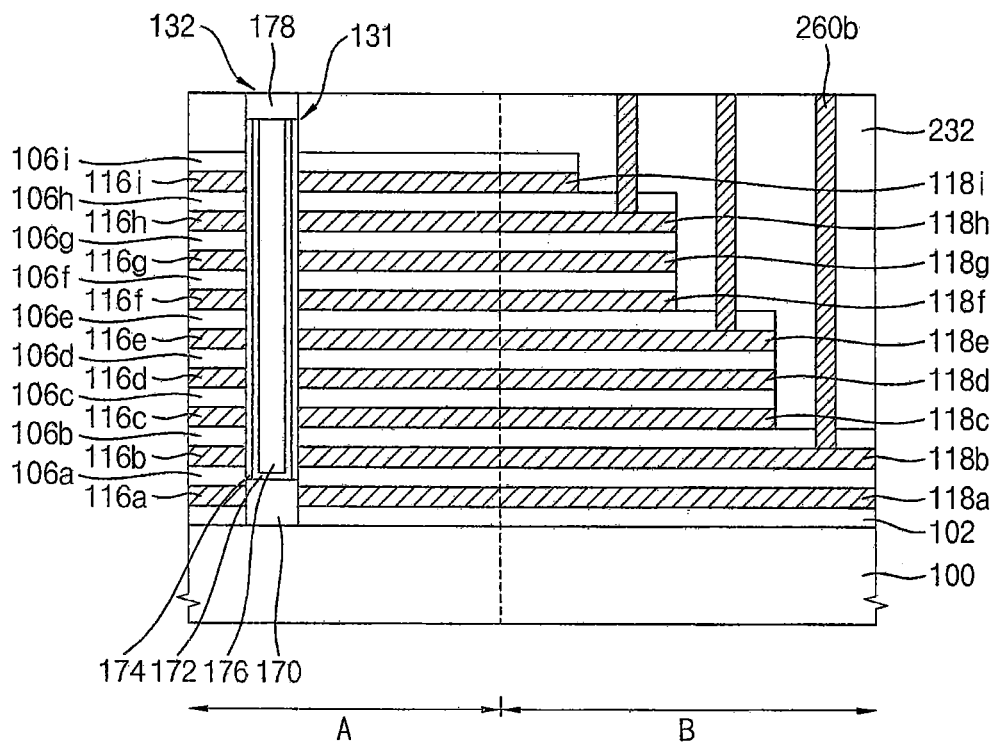
Figure 23C:
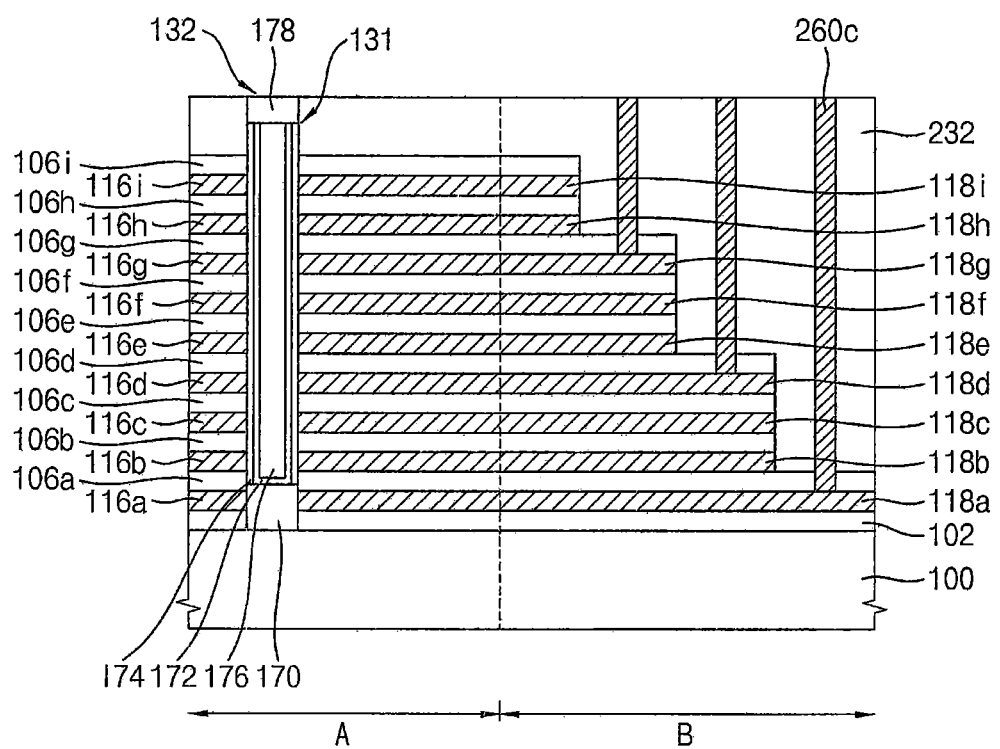

Specifically, FIGS. 23A, 23B and 23C are cross-sectional views taken along the lines I-I', II-II', III-III', respectively, in FIG. 22. The vertical memory device may include elements substantially the same as or similar to those of FIGS. 1A, 1B, 2, 3A and 3B. Thus, like reference numerals refer to like elements, and detailed descriptions thereon are omitted herein.

Referring to FIGS. 22, 23A, 23B and 23C, the substrate 100 (refer to FIG. 1) may include the cell region A and the wiring region B. The wiring region B may be adjacent to edge portions of the cell region A in the second direction.

The vertical channel structure 132 may be formed on the substrate 100 and may extend in the first direction. A gate line structure 250 may include a plurality of gate lines 116 (e.g., 116a, 116b, 116c, 116d, 116e, 116f, 116g, 116h and 116i) sequentially stacked in the first direction. Each of the gate lines 116 may surround the vertical channel structure 132 and may extend in the second direction. A first step pattern structure 252, a second step pattern structure 254 and a third step pattern structure 256 may contact edge portions of the gate line structure 250 in the second direction. The gate line structure 250 and the vertical channel structure 132 may be formed on the cell region A, and the first, second and third step pattern structures 252, 254 and 256 may be formed on the wiring region B.

The vertical channel structure 132 may include the channel, the tunnel insulation layer, the charge storage layer and the blocking dielectric layer, and the filling insulation pattern. The vertical channel structure 132 may extend in the first direction through the gate line structure 250.

The gate line structure 250 may include the gate lines 116 and the insulation layers 106 (e.g., 106a, 106b, 106c, 106d, 106e, 106f, 106g, 106h and 106i) alternately and repeatedly stacked.

The first, second and third step pattern structures 252, 254 and 256 may include the extended gate lines 118 and the insulation layers 106 alternately and repeatedly stacked. The extended gate lines 118 may contact the edge portions of the gate lines 116 in the second direction, respectively. The insulation layer 106 may be formed between the extended gate lines 118 disposed in the first direction. That is, the gate line structure 250, and the first, second and third step pattern structures 252, 254 and 256 may be an integral structure, which may be referred to as a gate structure 258.

In the first, second and third step pattern structures 252, 254 and 256, the extended gate lines 118 and the insulation layers 106 may have gradually decreasing lengths in the second direction from a bottom level toward a top level as illustrated in FIGS. 23A, 23B and 23C. That is, in the first, second and third step pattern structures 252, 254 and 256, the extended gate lines 118 and the insulation layers 106 at the bottom level may more protrude in the second direction from the extended gate lines 118 and the insulation patterns 106 than at the top level. Thus, each of the first, second and third step pattern structures 252, 254 and 256 may have a stepped shape.

Each of the step layers in the first, second and third step pattern structure 252, 254 and 256 may include three extended gate lines 118 sequentially stacked. In example embodiments, each of the first, second and third step pattern structure 252, 254 and 256 may include a plurality of step layers sequentially stacked in the first direction, and the number of the step layers may be a third of the number of the gate lines 116 sequentially stacked in the first direction in the gate line structure 250. For example, when the gate line structure 150 includes nine gate lines 116 sequentially stacked in the first direction, the each of the first, second and third step pattern structure 252, 254 and 256 may include three step layers sequentially stacked in the first direction.

Referring to FIG. 23A, an m-th one of the extended gate lines 118 (m is a multiple of 3) from the upper surface of the substrate 100, i.e., the m-th extended gate line, may be disposed at an upper portion of each step layer in the first step pattern structure 252. That is, a protruding portion of the m-th extended gate line in the second direction, e.g., each of the protruding portions of the third, sixth and ninth extended gate lines 118c, 118f and 118i, in the second direction may serve as a pad region for contacting a first contact plug 260a. Thus, electrical signals may be applied to each of the gate lines 116, e.g., each of the third, sixth and ninth gate lines 116c, 116f and 116i, disposed at the m-th levels from the upper surface of the substrate 100 via the first contact plug 260a contacting the pad region of the first step pattern structure 252. The pad region may be covered by the insulation layer 106. In the first step pattern structure 252, a plurality of pad regions e.g., third, sixth and ninth pad regions 243, 246 and 249 may be defined from the upper surface of the substrate 100 in the first direction.

Referring to FIG. 23B, an (m-1)-th one of the extended gate lines 118 (m is a multiple of 3) from the upper surface of the substrate 100, i.e., the (m-1)-th extended gate line, may be disposed at an upper portion of each step layer in the second step pattern structure 254. That is, a protruding portion of the (m-1)-th extended gate line in the second direction, e.g., each of the protruding portions of the second, fifth and eighth extended gate lines 118b, 118e and 118h in the second direction may serve as a pad region for contacting a second contact plug 260b. Thus, electrical signals may be applied to each of the gate lines 116, e.g., each of the second, fifth and eighth gate lines 116b, 116e and 116h disposed at the (m-1)-th levels from the upper surface of the substrate 100 via the second contact plug 260b contacting the pad region of the second step pattern structure 254. In the second step pattern structure 254, a plurality of pad regions e.g., second, fifth and eighth pad regions 242, 245 and 248 may be defined from the upper surface of the substrate 100 in the first direction. The pad region may be covered by the insulation layer 106.

Referring to FIG. 23C, an (m-2)-th one of the extended gate lines 118 (m is a multiple of 3) from the upper surface of the substrate 100, i.e., the (m-2)-th extended gate line, may be disposed at an upper portion of each step layer in the third step pattern structure 256. That is, a protruding portion of the (m-2)-th extended gate line in the second direction, e.g., each of the protruding portions of the first, fourth and seventh extended gate lines 118a, 118d and 118g in the second direction may serve as a pad region for contacting a third contact plug 260c. Thus, electrical signals may be applied to each of the gate lines 116, e.g., each of the first, fourth and seventh gate lines 116a, 116d and 116g disposed at the (m-2)-th levels from the upper surface of the substrate 100 via the third contact plug 260c contacting the pad region of the third step pattern structure 256. In the third step pattern structure 256, a plurality of pad regions e.g., first, fourth and seventh pad regions 241, 244 and 247 may be defined from the upper surface of the substrate 100 in the first direction. The pad region may be covered by the insulation layer 106.

The gate line structure 250 may contact the first to third step pattern structures 252, 254 and 256. Each of the first to third step pattern structures 252, 254 and 256 may extend in the second direction. The first and the second pattern structures 252, 254 may contact each other and the second and third step pattern structures 254, 256 may contact each other.

In the first to third step pattern structures 252, 254 and 256, the m-th pad region, the (m-1)-th pad region, and the (m-2)-th pad region disposed in the third direction may have heights, in the first direction, different from one another.

The gate line structure 250 may have a first width in the third direction. An integral structure including the first, second and third step pattern structures 252, 254 and 256 contacting the gate line structure 250 may have the first width in the third direction. In some embodiments, a sum of the widths of the first, second and third step pattern structures 252, 254 and 256 in the third direction may be equal to the first width. That is, the gate structure 258 may have the first width in the third direction.

In the third step pattern structures 256, widths of the pad regions in the third direction may decrease (e.g., gradually decrease) from a bottom level toward a top level. Thus, the width of the first pad region 241 in the third direction may be greater than a width in the third direction of the fourth pad region 244. The width in the third direction of the fourth pad region 244 may be greater than a width of the seventh pad region 247 in the third direction.

In the first step pattern structures 252, widths of the pad regions in the third direction may increase (e.g., gradually increase) from a bottom level toward a top level. Thus, the width of the third pad regions 243 in the third direction may be less than a width of the sixth pad region 246 in the third direction. The width of the sixth pad region 246 in the third direction may be less than a width of the ninth pad region 249 in the third direction.

Areas of the (m-2)-th pad regions of the third step pattern structure 256 may decrease (e.g., gradually decrease) from the bottom level toward the top level. Areas of the m-th pad regions of the first step pattern structure 252 may increase (e.g., gradually increase) from the bottom level toward the top level.

The second step pattern structure 254 may be formed between the first and third step pattern structures 252 and 256. Widths of pad regions of the second step pattern structure 254 in the third direction may substantially uniform. However, upper ones of the pad regions of the second step pattern structure 254 may be shifted from lower ones thereof in the third direction.

Thus, the pad regions of the first step pattern structure 252 may have different widths at respective levels, and the pad regions of the third step pattern structure 256 may have different widths at respective levels. The pad regions of the second step pattern structure 254 may be disposed at different positions at respective levels in a plan view as illustrated in FIG. 22.

Referring to FIG. 22, each of the pad regions of the third step pattern structure 256 may have a rounded corner C1 at a boundary area between the second and third step pattern structures 254 and 256, particularly, at a portion of the boundary area between the second and third step pattern structures 254 and 256 that is closest to the gate line structure 250. Thus, a sidewall of the second step pattern structure 254 near the portion of the boundary area between the second and third step pattern structures 254 and 256 that is closest to the gate line structure 250 may not be bent sharply. That is, in a plan view, each of the pad regions of the third step pattern structure 256 may include a corner having an arc shape.

Each of the pad regions of the second step pattern structure 254 may have a rounded corner C2 at a boundary area between the first and second step pattern structures 252 and 254, particularly, at a portion of the boundary area between the first and second step pattern structures 252 and 254 that is closest to the gate line structure 250. Thus, a sidewall of the first step pattern structure 252 near the portion of the boundary area between the first and second step pattern structures 252 and 254 that is closest to the gate line structure 250 may not be bent sharply. That is, in a plan view, each of the pad regions of the second step pattern structure 254 may include a corner having an arc shape.

An insulating interlayer 232 may cover the gate structure 258 and the vertical channel structure 132. The insulating interlayer 232 may include, for example, silicon oxide.

As each of the pad regions of each of the second and third step pattern structures 254 and 256 may have the rounded corners C2 and C1, the insulating interlayer 232 may sufficiently and easily fill the boundary area between the first and second step pattern structures 252 and 254 and the boundary area between the second and third step pattern structures 254 and 256. Thus, there may be no or little void therein.

The first contact plug 260a, the second contact plug 260b and the third contact plug 260c may extend through the insulating interlayer 232, and may contact the extended gate lines 118 of the pad regions in the first, second and third step pattern structures 252, 254 and 256, respectively.

The pad regions of the first step pattern structure 252 may have different widths in the third direction at respective levels, and the pad regions of the third step pattern structure 256 may have different widths in the third direction at respective levels. The pad regions of the second step pattern structure 254 may be disposed at different positions at respective levels. Thus, the first, second and third contact plugs 260a, 260b and 260c may be variously disposed on the pad regions, respectively.

In example embodiments, in a plan view, each of the first, second and third contact plugs 260a, 260b and 260c may be arranged in the second direction, the third direction, or in a diagonal direction with respect to the second direction. In some example embodiments, in a plan view, each of the first, second and third contact plugs 260a, 260b and 260c may be arranged in a zig-zag pattern. In some embodiments, in a plan view, each of the first, second and third contact plugs 260a, 260b and 260c may be disposed at central portions of the pad regions, respectively.

For convenience of descriptions, FIGS. 22, 23A, 23B and 23C show the gate lines 116 are sequentially stacked at 9 levels, respectively. However, the number of the gate lines 116 in the third direction may be properly adjusted in consideration of the circuit design or the degree of integration of the vertical memory device.

A plurality of gate structures 258 may be spaced apart from each other in the third direction. That is, an opening 234 may be formed between neighboring ones of the gate structures 258 in the third direction, and may extend in the second direction. An insulation pattern (not shown) may be formed in the opening 234. The insulation pattern may include, for example, silicon oxide.

Neighboring ones of the gate structures 258 in the third direction may be symmetric with respect to the opening 234. For example, first one of the gate structures 258 may include the first, second and third step pattern structures 252, 254 and 256 disposed in this order from left to right in the third direction, and a second one of the gate structures 258 adjacent the first one in the third direction may include the third, second and first step pattern structures 256, 254 and 252 disposed in this order from left to right in the third direction as illustrated in FIG. 22.

Impurity region (not shown) may be formed at an upper surface of the substrate 100 under the insulation pattern. The impurity region may extend in the second direction, and may serve as a common source line (CSL) of the vertical memory device.

FIGS. 24 to 30 are perspective views, plan views and cross-sectional views illustrating a method of manufacturing a vertical memory device in accordance with example embodiments.

The method of manufacturing the vertical memory device may include processes substantially the same as or similar to those illustrated with reference to FIGS. 4 to 18. Thus, like reference numerals refer to like elements, and detailed descriptions thereon are omitted herein.

Figure 24:
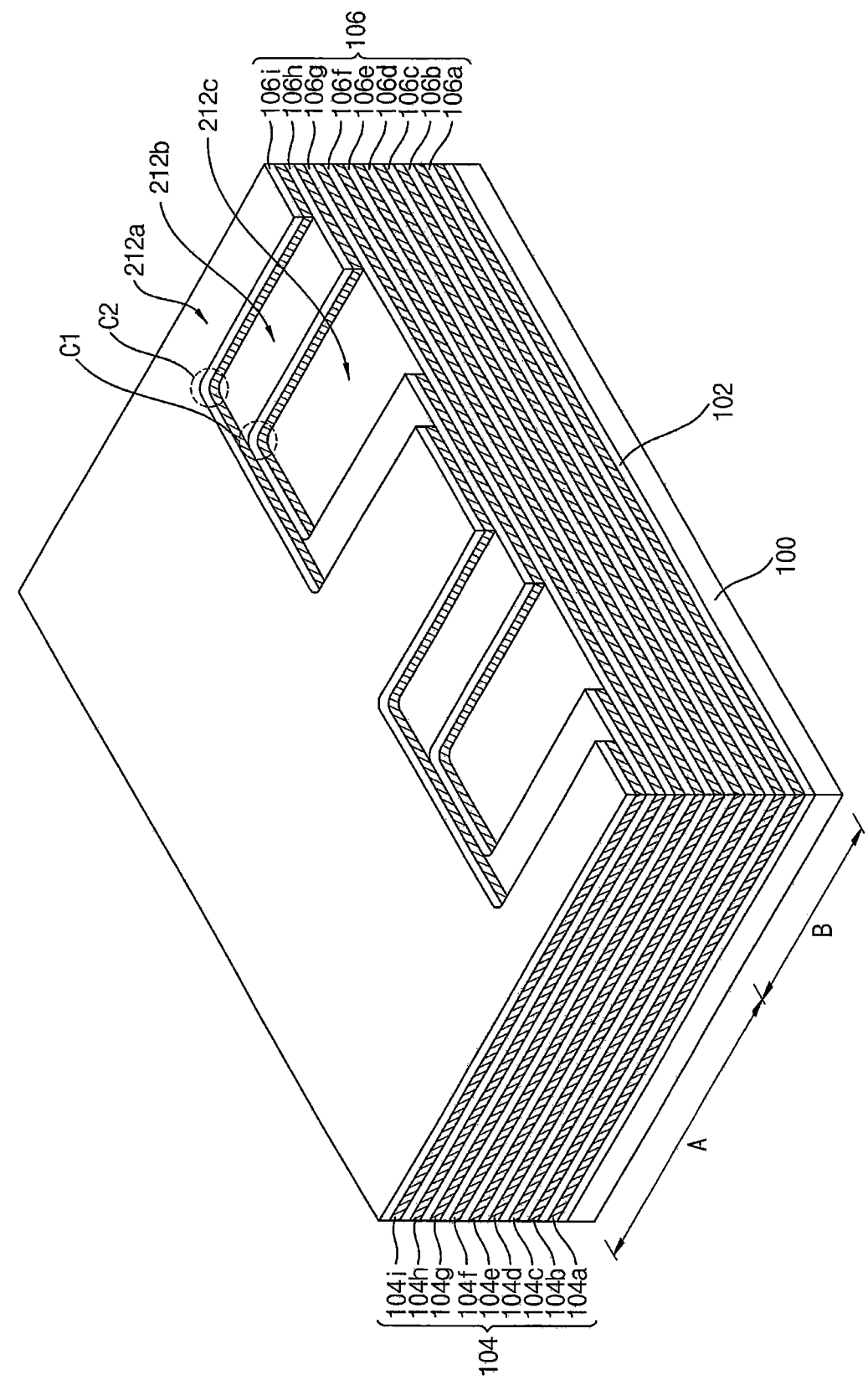

Referring to FIG. 24, the pad insulation layer 102 may be formed on the substrate 100. The sacrificial layers 104 (e.g., 104a through 104i) and the insulation layers 106 (e.g., 106a through 106i) and may be formed alternately and repeatedly on the pad insulation layer 102 to form a mold structure. The insulation layers 106 and the sacrificial layers 104 on the wiring region B may be partially etched to form a first lower step portion 212b and a second lower step portion 212c.

In example embodiments, a first photoresist pattern (not shown) may be formed on the mold structure by a photo process. The first photoresist pattern may expose an upper portion of the mold structure on the wiring region B. The uppermost one of the insulation layers 106i and the uppermost one of the sacrificial layers 104i may be etched using the first photoresist pattern as an etching mask to form a preliminary lower step portion. Then, the first photoresist pattern may be removed.

A second photoresist pattern (not shown) may be formed on the mold structure including the preliminary lower step portion by a photo process. The second photoresist pattern may expose a central portion of the preliminary lower step portion. One of the insulation layers 106 and one of the sacrificial layers 104 under the preliminary lower step portion may be etched using the second photoresist pattern. Thus, the mold structure on the wiring region B may include an upper step portion 212a, a first lower step portion 212b, a second lower step portion 212c, and second lower step portion 212c, the first lower step portion 212b and the upper step portion 212a may be sequentially disposed in this order in the third direction. The number of insulation layers 106 and the sacrificial layers 104 under the upper step portion 212a may be greater by one than the number of insulation layers 106 and the sacrificial layers 104 under the first lower step portion 212b, respectively. The number of insulation layers 106 and the sacrificial layers 104 under the upper step portion 212a may be greater by two than the number of insulation layers 106 and the sacrificial layers 104 under the second lower step portion 212c, respectively.

In some example embodiments, a first photoresist pattern may be formed on the mold structure by a photo process, and a portion of the mold structure corresponding to the second lower step portion 212b may be partially etched using the first photoresist pattern as an etching mask. The first photoresist pattern may be partially removed by a trimming process to form a trimmed first photoresist pattern. Portions of the mold structure corresponding to the first and second lower step portions 212a and 212b may be partially etched using the trimmed first photoresist pattern as an etching mask. Thus, the mold structure on the wiring region B may include the upper step portion 212a, the first lower step portion 212b, the second lower step portion 212c, the first lower step portion 212b and the upper step portion 212a sequentially disposed in this order in the third direction.

In example embodiments, widths of the upper step portion 212a and the second lower step portion 212c may be substantially the same as each other. That is, each of the upper step portion 212a and the second lower step portion 212c may have a second width in the third direction. The first lower step portion 212b may have a width of about half of the second width.

A first step pattern structure may be subsequently formed from the upper step portion 212a. A second step pattern structure may be subsequently formed from the first lower step portion 212b. A third step pattern structure may be subsequently formed from the second lower step portion 212c.

In a plan view, each of the first and second lower step portions 212b and 212c may have a shape of a rectangle, however, ones of corners of the rectangle, which may be close to the cell region A, may be rounded as shown in the regions C1 and C2 in FIG. 24. That is, a sidewall of each of the upper step portion 212a and the first upper step portion 212b near the corners of the rectangular shape of each of the first and second lower step portions 212b and 212c that are close to the cell region A may not be bent sharply.

During the etching process for forming the first and second lower step portions 212b and 212c, the above portion of the mold structure near the upper step portion 212a and the first lower step portion 212b, respectively, may be etched less than other portions thereof due to the three-dimensional effect, and thus each of the first and second lower step portions 212b and 212c may have the rounded corners. In example embodiments, in the etching process for forming the first and second lower step portions 212b and 212c, process conditions may be controlled so that an etch rate of the above portion of the mold structure near the upper step portion 212a and the first lower step portion 212b may be less than an etch rate of other portions thereof.

Figure 25:
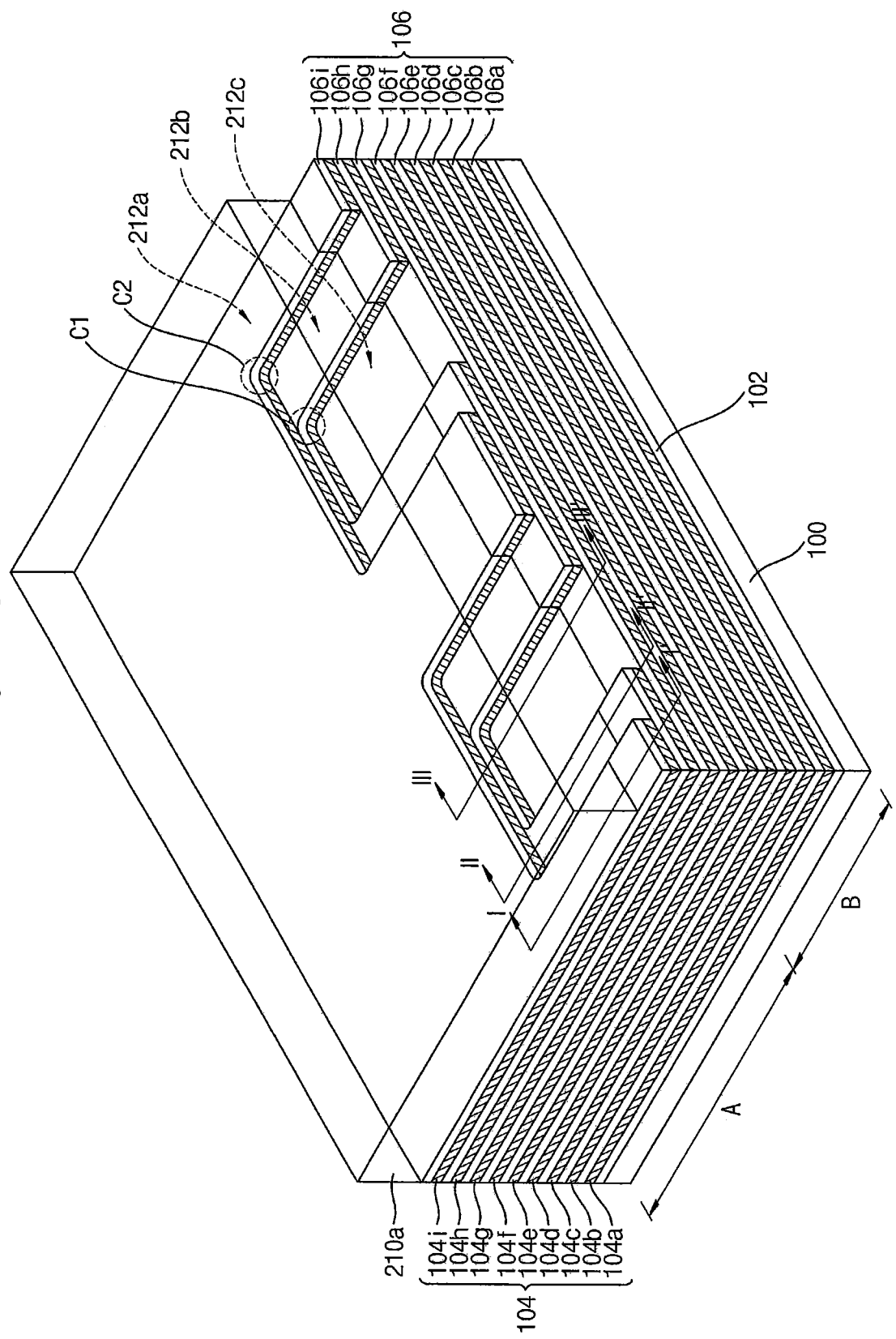
Figure 26A:
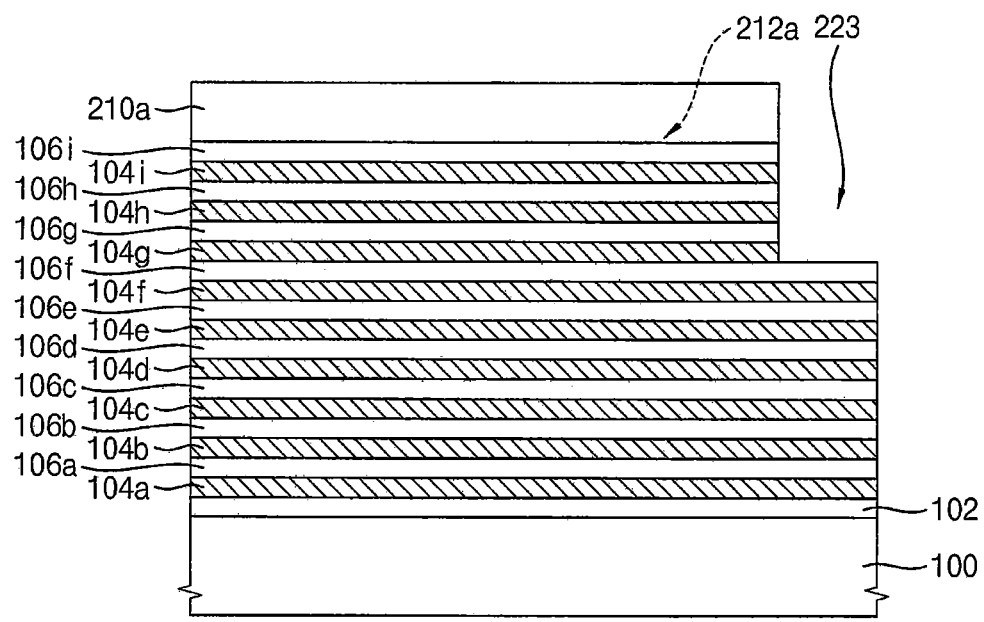
Figure 26B:
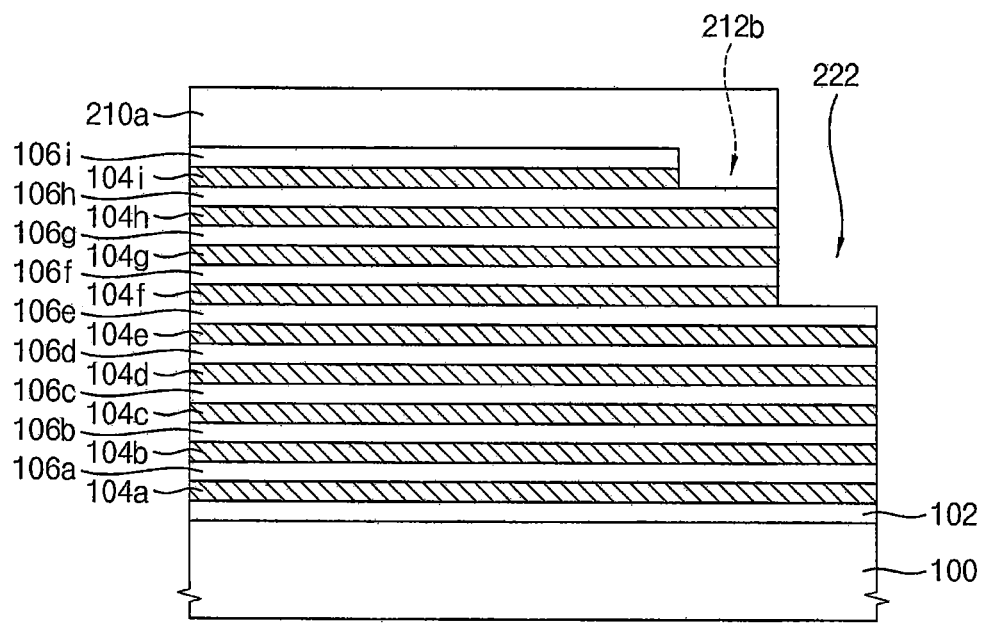
Figure 26C:
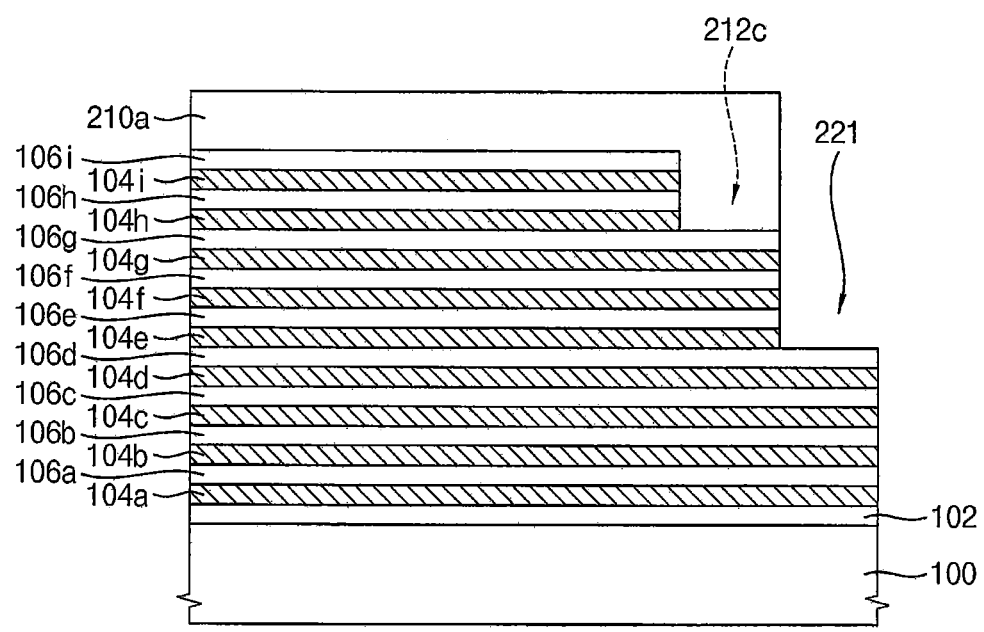
Figure 27:
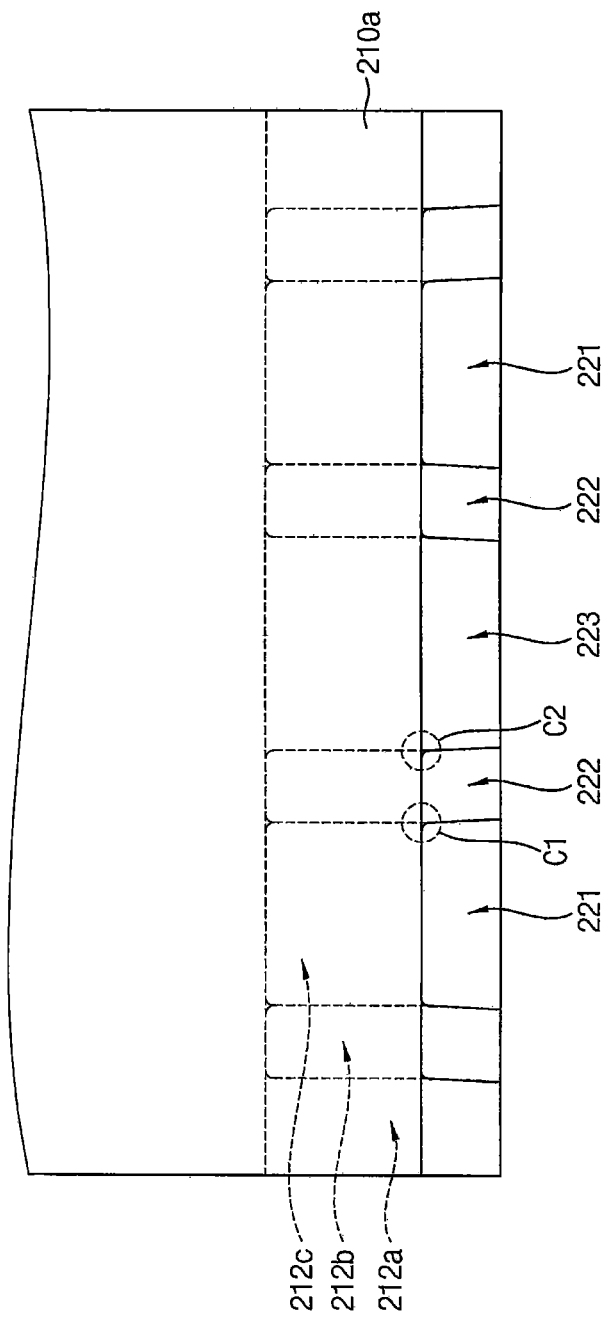
Figure 28A:
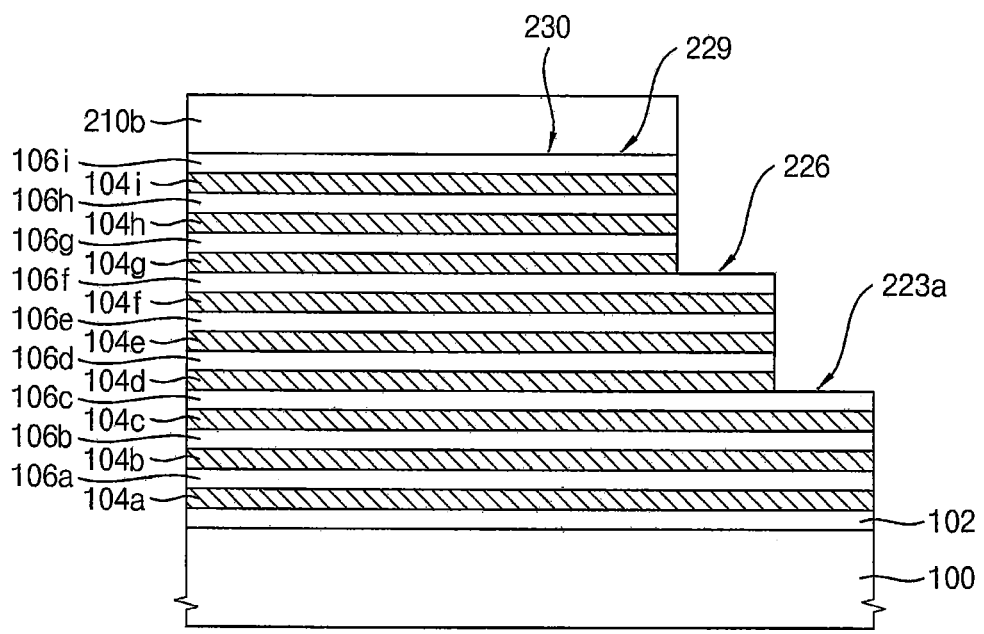
Figure 28B:
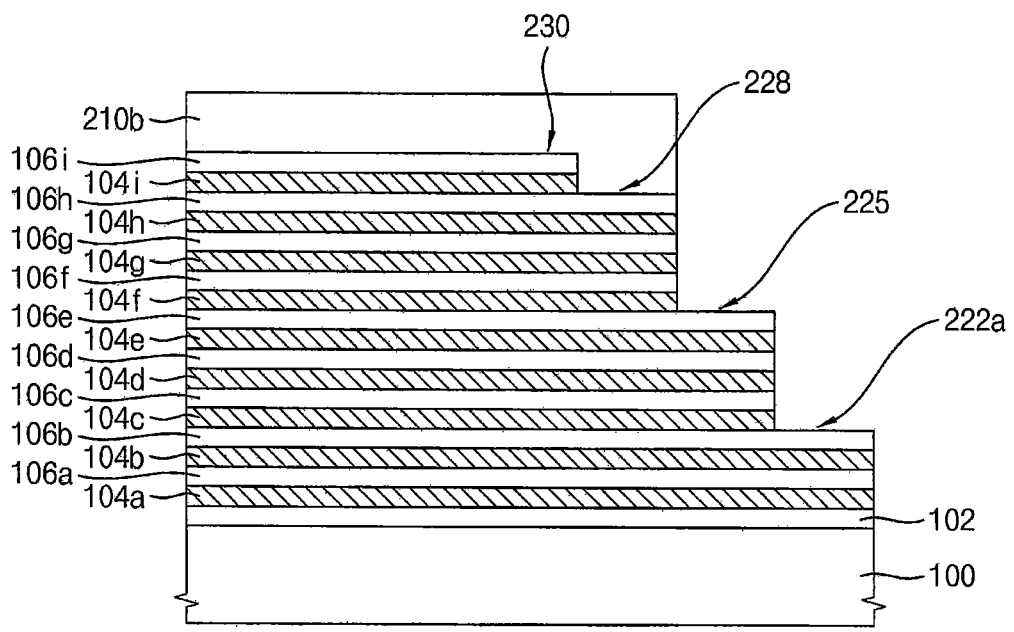
Figure 28C:
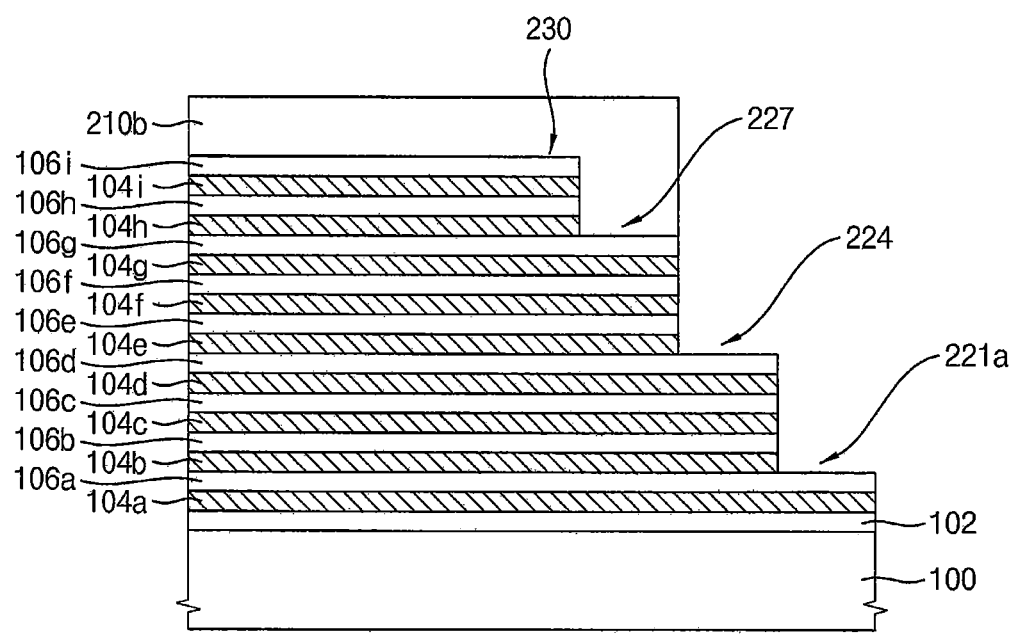

Referring to FIG. 25, a third photoresist pattern 210a may be formed on the mold structure including the first and second lower step portions 212b and 212c.

The third photoresist pattern 210a may be formed to expose an edge portion of the mold structure on the wiring region B. In example embodiments, the exposed portion by the third photoresist pattern 210a may extend in the third direction. A width in the second direction of the exposed portion by the third photoresist pattern 210a may be substantially the same as a width in the second direction of a pad region subsequently formed.

Referring to FIGS. 26A, 26B, 26C and 27, upper three stacked insulation layers 106 and upper three stacked sacrificial layers 104 of the mold structure may be etched using the third photoresist pattern 210a as an etching mask. Thus, the second and first lower step portions 212c and 212b and the upper step portion 212a may be partially etched to form a first preliminary pad region 221, a second preliminary pad region 222 and a third preliminary pad region 223 at fourth, fifth and sixth levels, respectively.

That is, an upper surface of the first preliminary pad region 221 may be lowest, and an upper surface of the third preliminary pad region 223 may be highest. Each of the first and second preliminary pad regions 221 and 222 may have a shape of a rectangle in a plan view.

In a plan view, the first preliminary pad region 221 may have a shape of a rectangle, however, ones of corners C1 of the rectangle, which may be close to the cell region A, may be rounded. Additionally, in a plan view, the second preliminary pad region 222 may have a shape of a rectangle, however, ones of corners of the rectangle, which may be close to the cell region A, may be rounded.

Referring to FIGS. 28A, 28B, 28C and 29, the third photoresist pattern 210a may be partially removed by a trimming process to form a fourth photoresist pattern 210b. Upper three stacked insulation layers 106 and upper three stacked sacrificial layers 104 of the mold structure may be etched using the fourth photoresist pattern 210b as an etching mask.

In example embodiments, an exposed portion by the fourth photoresist pattern 210b may extend in the third direction. A width in the second direction of the exposed portion by the fourth photoresist pattern 210b may be substantially twice the width in the second direction of the pad region subsequently formed.

Thus, the first and second lower step portions 212b and 212c and the upper step portion 212a may be partially etched to form a fourth preliminary pad region 224, a fifth preliminary pad region 225 and a sixth preliminary pad region 226 at fourth, fifth and sixth levels, respectively. Also, the first, second and third preliminary pad regions 221, 222 and 223 at the fourth, fifth and sixth levels may be partially etched to form a first preliminary pad portion 221a, a second preliminary pad portion 222a and a third preliminary pad portion 223a at first, second and third levels, respectively.

Upper surfaces of the fourth, fifth and sixth preliminary pad regions 224, 225 and 226 may have heights, in the first direction, gradually increasing in this order. An upper surface of the fourth preliminary pad region 224 may be higher than those of the first, second and third preliminary pad portion 221a, 222a and 223a.

Then, the fourth photoresist pattern may be removed. The second lower step portion 212c, the first lower step portion 212b and the upper step portion 212a may be exposed, and may serve as a preliminary seventh pad region 227, a preliminary eighth pad region 228 and a preliminary ninth pad region 229 at seventh, eighth and ninth levels, respectively. Thus, the preliminary step mold structure 230 including the preliminary pad regions may be formed.

Each of the preliminary pad regions may have a shape of a rectangle.

Figure 29:
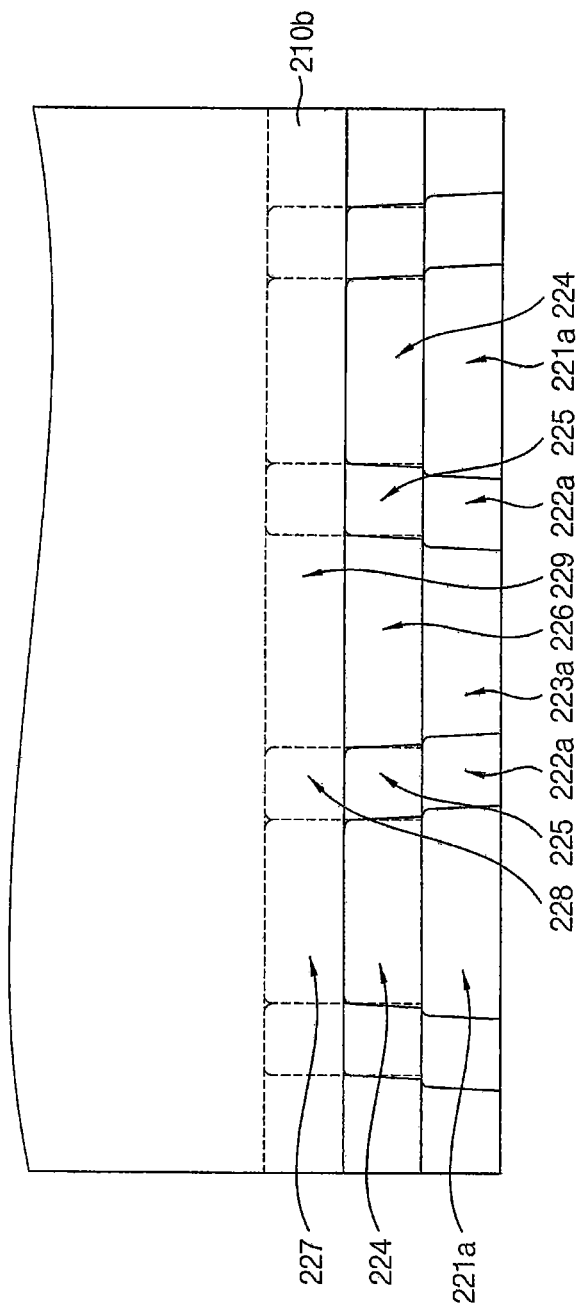
Figure 30:
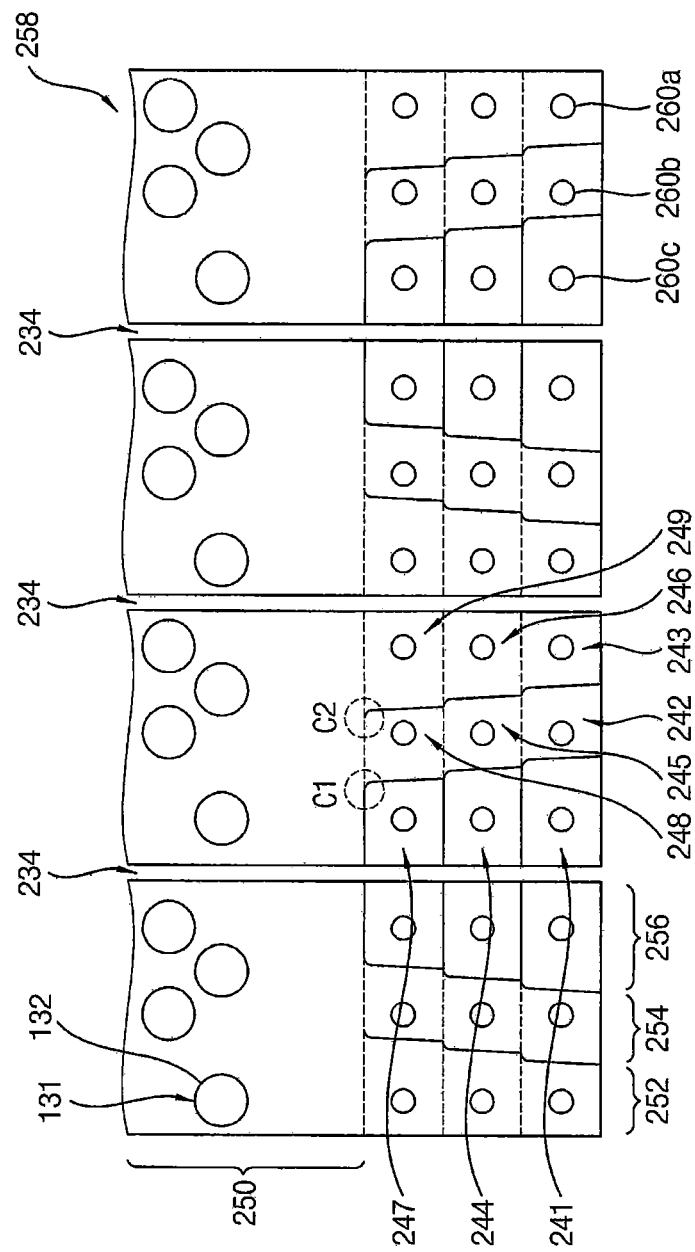

The seventh preliminary pad region 227 may have a rounded corner at a boundary area between the seventh and eighth preliminary pad regions 227 and 228, particularly, at a portion of the boundary area between the seventh and eighth preliminary pad regions 227 and 228 that is closest to the cell region A. Thus, a sidewall of the eighth preliminary pad region 228 near the portion of the boundary area between the seventh and eighth preliminary pad regions 227 and 228 that is closest to the cell region A may not be bent sharply. Additionally, the fourth preliminary pad region 224 may have a rounded corner at a boundary area between the fourth and fifth preliminary pad regions 224 and 225, particularly, at a portion of the boundary area between the fourth and fifth preliminary pad regions 224 and 225 that is closest to the cell region A. Thus, a sidewall of the fifth preliminary pad region 225 near the portion of the boundary area between the fourth and fifth preliminary pad regions 224 and 225 that is closest to the cell region A may not be bent sharply. Furthermore, the first preliminary pad region 221a may have a rounded corner at a boundary area between the first and second preliminary pad regions 221a and 222a, particularly, at a portion of the boundary area between the first and second preliminary pad regions 221a and 222a that is closest to the cell region A. Thus, a sidewall of the second preliminary pad region 222a near the portion of the boundary area between the first and second preliminary pad regions 221a and 222a that is closest to the cell region A may not be bent sharply as illustrated in FIG. 29.

The preliminary pad regions may be formed by performing the etching processes different times from each other. Thus, widths in the third direction of the preliminary pad regions may be different from each other.

The preliminary pad regions formed from the second lower step portion 212c may have widths in the third direction gradually increasing according to the number of the etching process, and the widths in the third direction may gradually decrease from a bottom level toward a top level. Thus, the first preliminary pad region 221a may have a greatest width in the third direction, and the seventh preliminary pad region 227 may have a smallest width in the third direction.

The preliminary pad regions formed from the upper step portion 212a may have widths in the third direction gradually decreasing according to the number of the etching process, and the widths in the third direction may gradually increase from a bottom level toward a top level. Thus, the third preliminary pad region 223a may have a smallest width in the third direction, and the ninth preliminary pad region 229 may have a greatest width in the third direction.

Referring to FIGS. 30, 22, 23A and 23B, processes substantially the same as or similar to those illustrated with reference to FIGS. 13 to 18 may be performed.

In some embodiments, the insulating interlayer 232 may be formed on the preliminary step mold structure. The channel hole 131 may be formed through the insulating interlayer 232 and the preliminary step mold structure in the cell region A. The vertical channel structure 132 may be formed in the channel hole 131. The insulating interlayer 232, the preliminary step mold structure and the pad insulation layer may be etched to form the opening 234. The preliminary step mold structure may be divided into a plurality of step mold structures by the plurality of openings 234. The sacrificial layers 104 of the step mold structure may be replaced with conductive patterns to form the gate line structure 250, the first step pattern structure 252, the second step pattern structure 254 and the third step pattern structure 256.

Impurity region (not shown) may be formed at an upper surface of the substrate 100 exposed by the opening 234. An insulation pattern (not shown) may be formed to fill the opening 234.

The first contact plug 260a, the second contact plug 260b and the third contact plug 260c may be formed on the pad regions of the first step pattern structure 252, the second step pattern structure 254 and the third step pattern structure 256, respectively.

Thus, the vertical memory device of semiconductor of FIGS. 22, 23A and 23B may be manufactured.

In the vertical memory device, the vertical channel structure on the cell region may not be limited to the above-illustrated one. That is, the vertical channel structure may have various types. The gate line structure surrounding the vertical channel structure and the first step pattern structure on the wiring region may have one of the structures in accordance with example embodiments.

Figure 31:
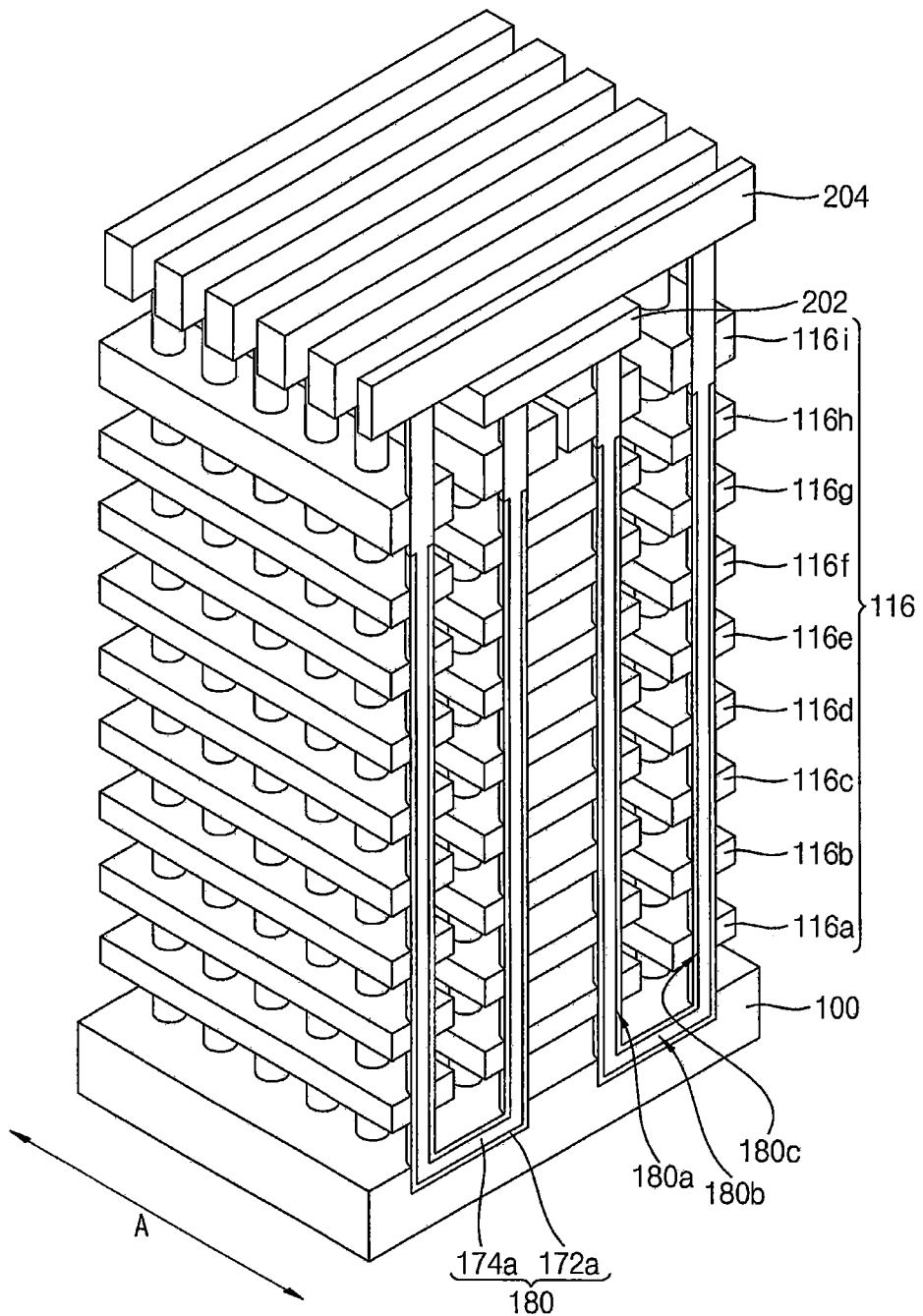

FIG. 31 is a perspective view illustrating a vertical memory device in accordance with example embodiments.

FIG. 31 illustrates only a structure on cell region, and does not show the insulating interlayer.

Referring to FIG. 31, a vertical channel structure 180 may be formed on the substrate 100. A gate structure may surround the vertical channel structure 180. The gate structure may include a gate line structure, a first step pattern structure and a second step pattern structure.

The vertical channel structure 180 may include a first structure 180a, a second structure 180c and a connection portion 180b. The first and second structures 180a and 180c may be adjacent to each other. Each of the first and second structures 180a and 180c may have a pillar shape extending in the first direction from the substrate 100. The connection portion 180b may be formed on the substrate 100, and may connect bottoms of the first and second structures 180a and 180c to each other. Thus, the vertical channel structure 180 may have a U-like shape.

The first and second structures 180a and 180c in the vertical channel structure 180 may be surrounded by gate lines included in different gate structures from each other.

The vertical channel structure 180 may include a channel 174a and a charge storage structure 172a including a tunnel insulation layer, a charge storage layer and a blocking dielectric layer. The channel 174a may have a U-like shape penetrating through different gate structures. The charge storage structure 172a may be formed on a surface of the channel 174a. The blocking layer may contact the gate lines.

In example embodiments, an upper potion of the vertical channel structure 180 may include only the channel 174a. That is, the upper potion of the vertical channel structure 180 may not include the tunnel insulation layer, the charge storage layer and the blocking dielectric layer.

The gate line structure may include gate lines 116 and insulation layers alternately and repeatedly stacked.

The gate lines 116 may include a ground selection line (GSL), word lines and a string selection line (SSL). For example, an uppermost one 116*i* of the gate lines 116 may serve as the GSL and a lowermost one 116*a* of the gate lines 116 may serve as the SSL. Intermediate ones 116*b* to 116*h* of the gate lines 116 between the GSL and the SSL may serve as the word lines.

In example embodiments, an uppermost one of the gate lines 116 surrounding the first structure 180*a* may serve as the GSL, an uppermost one of the gate lines 116 surrounding the second structure 180*c* may serve as the SSL.

The GSL and SSL may be formed at the upper portion of the vertical channel structure 180, so that a wiring between the SSL and the channel and a wiring between the GSL and the channel may be easily formed.

A common source line 202 may be formed on the first structure 180*a* and contact the GSL. The common source line 202 may extend in a second direction, which may be an extension direction of the gate line 116.

A bit line 204 may be formed on the second structure 180*c*, and may contact the SSL.

A first step pattern structure and a second step pattern structure may be formed on the wiring region. Each of the first and second step pattern structures may extend in the second direction from the gate line structure. The first and second step pattern structures may be substantially the same as or similar to the first and second step pattern structures illustrated in FIGS. 1, 2, 3A and 3B.

In example embodiments, the vertical memory device may be embodied to include a three dimensional (3D) memory array including a high step structure, e.g., 16 levels, 24 levels, 32 levels, 48 levels, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
    a substrate comprising opening regions extending in a first direction and a conductive line structure region between the opening regions, the conductive line structure region comprising a first region and a second region adjacent to each other in a second direction perpendicular to the first direction;
    a conductive line structure on the conductive line structure region, the conductive line structure comprising first conductive lines spaced apart from each other in a vertical direction substantially perpendicular to an upper surface of the substrate, wherein the conductive line structure on the first region comprises a first step structure comprising first steps, and the conductive line structure on the second region comprises a second step structure comprising second steps, and wherein heights of the second steps are different from heights of the first steps, respectively;
    first contact plugs on upper surfaces of the first steps of the first step structure, respectively; and
    second contact plugs on upper surfaces of the second steps of the second step structure, respectively,
    wherein a distance in the second direction between the second step structure and the opening region being spaced apart from the second step structure is increased toward a bottom level of the second steps,
    wherein exposed top surfaces of the first steps serves as first pad regions, respectively, and exposed top surfaces of the second steps serves as a second pad region, respectively, and wherein each of the first pad regions has a rounded corner at a boundary between the first and second regions, and
    wherein the opening regions are parallel to each other, and the boundary between the first and second regions extends so as to not be parallel to an extending direction of each of the opening regions.

2. The vertical memory device of claim 1, wherein heights of ones of the second steps are higher than heights of the first steps neighboring the ones of the second steps in the second direction.

3. The vertical memory device of claim 1, wherein the widths in the second direction of the first pad regions increase from a top level toward a bottom level of the first steps, and wherein the widths in the second direction of the second pad regions decrease from a top level toward a bottom level of the second steps.

4. The vertical memory device of claim 2, wherein each of the first pad regions has a shape of a rectangle having one rounded corner, in a plan view.

5. The vertical memory device of claim 1, wherein an arrangement of the first contact plugs are parallel to the opening regions, and an arrangement of the second contact plugs are parallel to the opening regions.

6. The vertical memory device of claim 1, wherein the first contact plugs are arranged in the first direction, and the second contact plugs are arranged in the first direction.

7. The vertical memory device of claim 1, further comprising:
    an insulating interlayer on the conductive line structure and the opening region.

8. The vertical memory device of claim 1, wherein the conductive line structure further comprises a cell structure portion not having a stepped shape, and further comprising a vertical channel structure extending through the cell structure portion in the vertical direction.

9. The vertical memory device of claim 1,
    wherein the conductive line structure include a plurality of conductive line structures, and
    wherein the plurality of conductive line structures are symmetrical to each other with respect to the opening.

10. A vertical memory device, comprising:
    a substrate comprising opening regions extending in a first direction and a conductive line structure region between the opening regions, the conductive line structure region comprising a first region and a second region adjacent to each other in a second direction perpendicular to the first direction;
    a conductive line structure on the conductive line structure region, the conductive line structure comprising first conductive lines spaced apart from each other in a vertical direction substantially perpendicular to an upper surface of the substrate, wherein the conductive line structure on the first region comprises a first step structure comprising first steps, and the conductive line structure on the second region comprises a second step structure comprising second steps, and wherein heights of the second steps are different from heights of the first steps, respectively;

an insulating interlayer on the conductive line structure and the opening region;

first contact plugs through the insulating interlayer, the first contact plugs on upper surfaces of the first steps of the first step structure, respectively; and second contact plugs through the insulating interlayer, the second contact plugs on upper surfaces of the second steps of the second step structure, respectively, wherein a distance in the second direction between the second step structure and the opening region being spaced apart from the second step structure is increased toward a bottom level of the second steps, wherein an arrangement of the first contact plugs are parallel to the opening regions, and an arrangement of the second contact plugs are parallel to the opening regions, and wherein the opening regions are parallel to each other, and the boundary between the first and second regions extends so as to not be parallel to an extending direction of each of the opening regions.

11. The vertical memory device of claim 10, wherein heights of ones of the second steps are higher than heights of the first steps neighboring the ones of the second steps in the second direction.

12. The vertical memory device of claim 11,
wherein exposed top surfaces of the first steps serve as first pad regions, respectively, and
wherein each of the first pad regions has a rounded corner at a boundary between the first and second regions.

13. The vertical memory device of claim 11, wherein each of the first pad regions has a shape of a rectangle having one rounded corner, in a plan view.

14. The vertical memory device of claim 10, wherein the first contact plugs are arranged in the first direction, and the second contact plugs are arranged in the first direction.

15. A vertical memory device, comprising:
a substrate comprising opening regions extending in a first direction and a conductive line structure region between the opening regions, the conductive line structure region comprising a first region to a n-th region, wherein n is a natural number of 2 or more, wherein the first region to the n-th region are adjacent to each other in a second direction perpendicular to the first direction;

a conductive line structure on the conductive line structure region, the conductive line structure comprising first conductive lines spaced apart from each other in a vertical direction substantially perpendicular to an upper surface of the substrate, wherein the conductive line structure on the first region comprises a first step structure comprising first steps, and the conductive line structure on the n-th region comprises an n-th step structure comprising n-th steps, and wherein heights of the n-th steps are different from heights of n-1-th steps, respectively;

first contact plugs on upper surfaces of the first steps, respectively; and n-th contact plugs on upper surfaces of the n-th steps of the n-th step structure, respectively, wherein the opening regions are parallel to each other, and a boundary between neighboring regions among the first region to the n-th region extends so as to not be parallel to an extending direction of each of the opening regions, wherein an arrangement of the first contact plugs are parallel to the opening regions, and an arrangement of the n-th contact plugs are parallel to the opening regions, and wherein exposed top surfaces of the first steps to the n-th steps serves as pad regions, respectively, and at least one of the pad regions has a rounded corner at the boundary between neighboring regions among the first region to the n-th region.

16. The vertical memory device of claim 15, wherein heights of ones of the n-th steps are higher than heights of the n-1-th steps neighboring the ones of the n-th steps in the second direction.

17. The vertical memory device of claim 15, wherein a distance in the second direction between the boundary between neighboring regions among the first region to the n-th region and one of the opening regions is increased toward bottom levels of the first steps to the n-th steps.

18. The vertical memory device of claim 15, wherein the first contact plugs are arranged in the first direction, and the n-th contact plugs are arranged in the first direction.

19. The vertical memory device of claim 15, further comprising an insulating interlayer on the conductive line structure and the opening region.

* * * * *